United States Patent
Kim et al.

(10) Patent No.: US 12,064,907 B2
(45) Date of Patent: Aug. 20, 2024

(54) ELECTRONIC DEVICE MEMBER OF METALLIC STRUCTURE AND NON-METALLIC STRUCTURE, AND METHOD FOR MANUFACTURING SAME

(71) Applicant: Samsung Electronics Co., Ltd., Gyeonggi-do (KR)

(72) Inventors: Changsu Kim, Gyeonggi-do (KR); Sangsik Na, Gyeonggi-do (KR); Rathore Pranveer Singh, Gyeonggi-do (KR); Youngjin Yi, Gyeonggi-do (KR); Jongbae Jeon, Gyeonggi-do (KR); Donghyeon Hwang, Gyeonggi-do (KR); Hangyu Hwang, Gyeonggi-do (KR); Jinhyeong Park, Gyeonggi-do (KR); Youngik Son, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 644 days.

(21) Appl. No.: 17/283,888

(22) PCT Filed: Oct. 25, 2019

(86) PCT No.: PCT/KR2019/014192
§ 371 (c)(1),
(2) Date: Apr. 8, 2021

(87) PCT Pub. No.: WO2020/085860
PCT Pub. Date: Apr. 30, 2020

(65) Prior Publication Data
US 2021/0347098 A1   Nov. 11, 2021

(30) Foreign Application Priority Data
Oct. 26, 2018   (KR) .................. 10-2018-0129014

(51) Int. Cl.
*H05K 5/00* (2006.01)
*B29C 45/14* (2006.01)
(Continued)

(52) U.S. Cl.
CPC ..... *B29C 45/14336* (2013.01); *H05K 5/0017* (2013.01); *H05K 5/04* (2013.01); *B29C 2793/009* (2013.01); *B29L 2031/34* (2013.01)

(58) Field of Classification Search
CPC ........ B29C 45/14336; B29C 2793/009; B29C 45/14647; B29C 45/14311;
(Continued)

(56) References Cited

U.S. PATENT DOCUMENTS

2016/0050302 A1* 2/2016 Lee ...................... H04B 1/3888
455/575.1
2017/0302766 A1   10/2017 Lee et al.
2018/0124221 A1   5/2018 Li et al.

FOREIGN PATENT DOCUMENTS

CN   206855907   1/2018
CN   207535221   6/2018
(Continued)

OTHER PUBLICATIONS

PCT/ISA/210 Search Report issued on PCT/KR2019/014192, Feb. 14, 2020, pp. 5.
(Continued)

*Primary Examiner* — Anthony Q Edwards
*Assistant Examiner* — Hung Q Dang
(74) *Attorney, Agent, or Firm* — The Farrell Law Firm, P.C.

(57) ABSTRACT

A method for manufacturing an electronic device, according to one embodiment of the present invention, may comprise the operations of: inserting and injecting a polymeric material into a structure, which is a plate-shaped metal structure
(Continued)

comprising a first surface and a second surface, the structure comprising: at least one opening penetrating the first surface and the second surface; and at least one recess having a first depth from the first surface and extending to have a repeating pattern selected from among a W-shape, a sawtooth shape, and a straight line shape, when viewed from above the first surface; and confirming that the recess is filled with the polymeric material. Various other embodiments are possible.

5 Claims, 32 Drawing Sheets

(51) Int. Cl.
  H05K 5/04 (2006.01)
  B29L 31/34 (2006.01)
(58) Field of Classification Search
  CPC ........ B29C 2045/14327; H05K 5/0017; H05K 5/04; B29L 2031/34; H04M 1/02; H04M 1/0202; H04M 2250/22
  See application file for complete search history.

(56) References Cited

FOREIGN PATENT DOCUMENTS

| JP | 06-091701 | * | 4/1994 | ............ B29C 45/26 |
|----|-----------|---|--------|--------------------------|
| JP | H 0691701 |   | 4/1994 |                          |
| KR | 1020020073596 |   | 9/2002 |                      |
| KR | 1020090021873 |   | 3/2009 |                      |
| KR | 10-0996199 |   | 11/2010 |                         |
| KR | 1020130012521 |   | 2/2013 |                      |
| KR | 1020160019833 |   | 2/2016 |                      |
| KR | 1020160147090 |   | 12/2016 |                     |

OTHER PUBLICATIONS

PCT/ISA/237 Written Opinion issued on PCT/KR2019/014192, Feb. 14, 2020, pp. 5.
Korean Office Action dated Sep. 13, 2022 Issued in counterpart application No. 10-2018-0129014, 17 pages.
KR Notice of Patent Grant dated Mar. 29, 2023 issued in counterpart application No. 10-2018-0129014, 5 pages.

* cited by examiner

ELECTRONIC DEVICE MEMBER OF METALLIC STRUCTURE AND NON-METALLIC STRUCTURE, AND METHOD FOR MANUFACTURING SAME

PRIORITY

This application is a National Phase Entry of International Application No. PCT/KR2019/014192, which was filed on Oct. 25, 2019, and claims priority to Korean Patent Application No. 10-2018-0129014, filed in the Korean Intellectual Property Office on Oct. 26, 2018, the entire content of each of which is incorporated herein by reference.

BACKGROUND

1. Field

Various embodiments of the present disclosure relate to an electronic device member of a metal structure and a non-metal structure, and a method for manufacturing the same.

2. Related Art

With the growth of digital technologies, electronic devices are being provided in various forms such as a smart phone, a tablet personal computer (PC), and a personal digital assistant (PDA) The electronic device is being developed even in the form of being wearable on a user to improve portability and user accessibility. In recent years, as part of an effort for increasing rigidity or strengthening a design perspective, electronic devices of metal appearances are attracting attention.

A member providing a metal appearance, for example, can be formed by putting a metal structure into a mold and then, inserting a molten resin, to form a hybrid structure in which a non-metal structure of a non-metallic material is bonded to a metal structure through injection (e.g., insert injection) and then, post processing (e.g., external form processing such as cutting) the hybrid structure. The quality of the member providing the metal appearance can be different according to various molding conditions (e.g., a pressure, a speed, a position, a time or a temperature) on injection. For example, if a mold temperature is decreased unintentionally, there can be an appearance fault such as a weld line, carbonization, and a black spot in the non-metal structure, or there can be a bonding fault (e.g., crack) between the metal structure and the non-metal structure. For example, if a temperature of a molten resin is lower or higher than a set temperature, there can be a fault in filling of the molten resin within the mold. When a non-metal structure of a complex shape has to be molded, it can be more difficult to check its filling fault. Faults may not be found in appearance inspection (e.g., visual inspection) which is executed for a hybrid structure after the injection structure consisting of a metal structure and a non-metal structure is formed through injection. However, the faults e.g., interfacial bonding faults between the metal structure and the non-metal structure) can be found in appearance inspection which is executed after the hybrid structure is post processed. If the post processing is carried out even though the hybrid structure involves the faults, a cost and time loss can be caused.

Various embodiments of the present disclosure can provide an electronic device member of a metal structure and a non-metal structure, and a method for manufacturing the same, for making it possible to easily determine an injection quality or injection defect, which is difficult to be determined after a hybrid structure in which the non-metal structure is bonded to the metal structure through injection is molded.

SUMMARY

According to an embodiment of the present disclosure, a method for manufacturing an electronic device can include the operations of inserting and injecting a polymeric material into a structure, which is a plate-shaped metal structure including a first surface and a second surface, wherein the structure includes at least one opening penetrating the first surface and the second surface, and at least one recess having a first depth from the first surface and extending to have a repeating pattern selected from among a W-shape, a sawtooth shape, and a straight line shape, when viewed from above the first surface, and checking whether the recess is filled with the polymeric material.

According to various embodiments of the present disclosure, because it is possible to determine an injection quality or injection defect which is difficult to be determined after a hybrid structure in which a non-metal structure of a polymeric material is bonded to a metal structure through injection is formed, an injection-defective hybrid structure can be sorted out before post processing and thus, a cost and time loss can be decreased.

Besides this, an effect obtainable or expected from various embodiments is directly or suggestively disclosed in a detailed description of an embodiment of the present disclosure. For instance, various effects expected according to various embodiments of the present disclosure will be disclosed in a detailed description described later.

DETAILED DESCRIPTION

Figure 1:
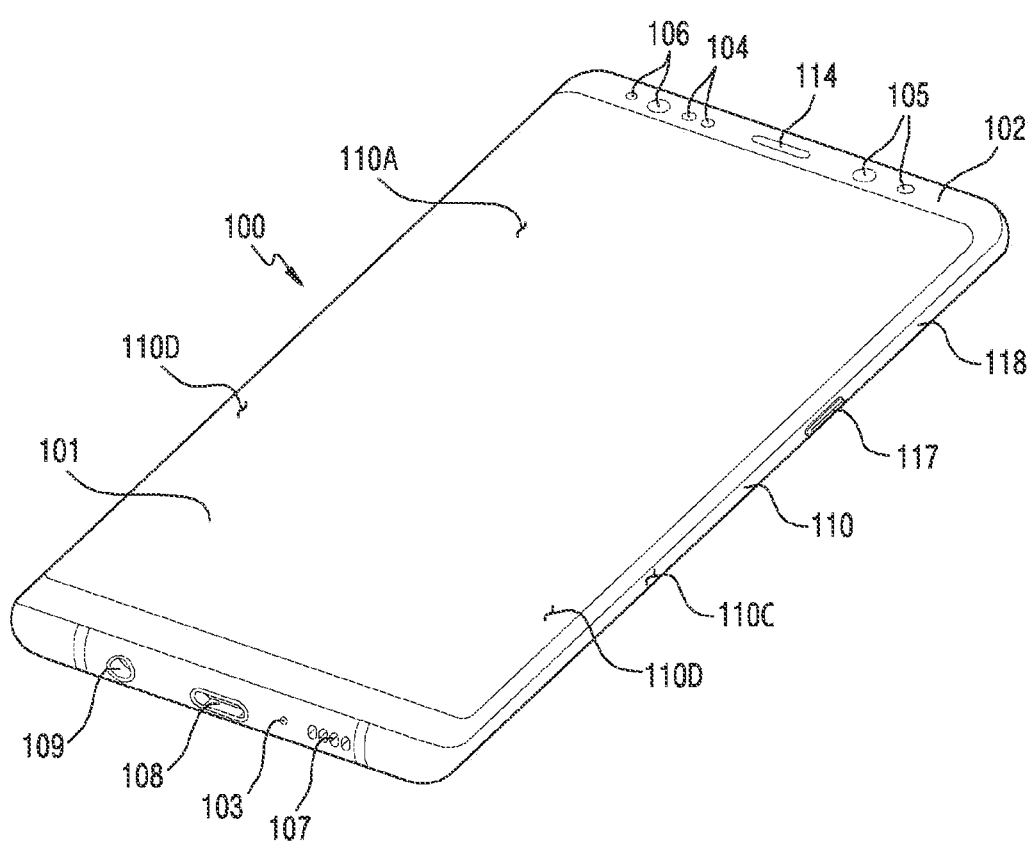
FIG. 1 is a front perspective view of a mobile electronic device according to an embodiment.

Various embodiments of the present document are mentioned below with reference to the accompanying drawings. Various embodiments of the present document and the terms used herein are not to limit technological features mentioned in the present document to specific embodiments, and should be construed as including various modifications, equivalents, or alternatives of the corresponding embodiment. With regard to a description of the drawings, like reference numerals can be used to refer like components. A singular form of a noun corresponding to an item can include one item or more, unless the relevant context clearly indicates otherwise. In the present document, the expressions "have", "can have", "comprise" or "can comprise", etc. indicate the existence of a corresponding feature (e.g., a numeral value, a function, an operation, or a component such as a part, etc.), and do not exclude the existence of an additional feature. In the present document, each of such phrases as "A or B", "at least one of A and B", "at least one of A or B," "A, B, or C", "at least one of A, B, and C", and "at least one of A, B, or C", can include all possible combinations of the items enumerated together in a corresponding one of the phrases. Such terms as "a first", "a second", or "the first" or "the second" can be used to simply distinguish a corresponding component from another corresponding component, and does not limit the corresponding components in another aspect (e.g., importance or sequence). If some (e.g., a first) component is referred to, with or without the term "operatively" or "communicatively", as "coupled with", "coupled to", "connected with", or "connected to" another (e.g., a second) component, it means that the some component can be connected with the another component directly (e.g., wiredly), wirelessly, or via a third component.

An electronic device of various embodiments disclosed in the present document can be devices of various forms. The electronic device, for example, can include a portable communication device (e.g., a smart phone), a computer device, a portable multimedia device, a portable medical device, a camera, a wearable device, or a home appliance. The electronic device of an embodiment of the present document is not limited to the aforementioned devices. In the present document, the term 'user' can denote a person who uses the electronic device or a device (e.g., artificial-intelligent electronic device) which uses the electronic device.

Figure 2:
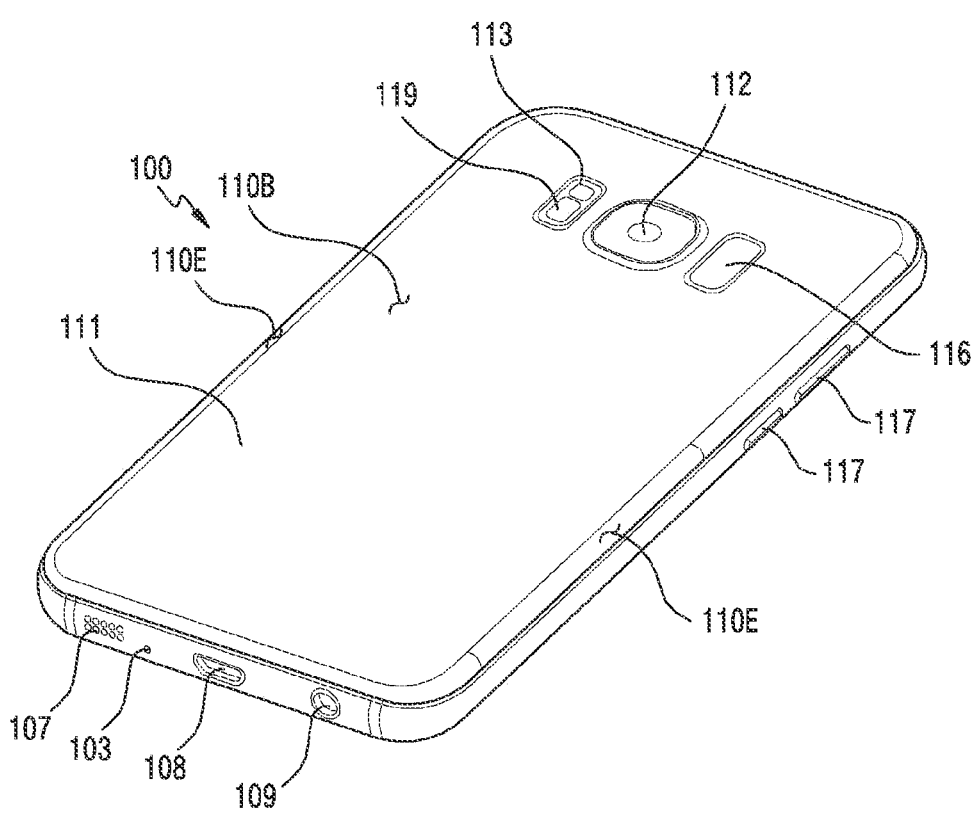
FIG. 2 is a rear perspective view of the electronic device of FIG. 1 according to an embodiment.

FIG. 1 is a front perspective view of a mobile electronic device according to an embodiment. FIG. 2 is a rear perspective view of the electronic device of FIG. 1 according to an embodiment.

Referring to FIGS. 1 and 2, the electronic device 100 of an embodiment can include a housing 110 which includes a first surface (or a front surface) 110A, a second surface (or a rear surface) 110B, and a side surface 110C surrounding a space between the first surface 110A and the second surface 110B. In another embodiment (not shown), the housing can denote a structure forming some of the first surface 110A, the second surface 110B and the side surface 110C of FIG. 1 as well. According to an embodiment, the first surface 110A can be formed by a front plate 102 (e.g., a glass plate including various coating layers, or a polymer plate) whose at least portion is substantially transparent. The second surface 110B can be formed by a substantially opaque hack plate 111. The back plate 111 can be formed of, for example, a coated or colored glass, a ceramic, polymer, a metal (e.g., aluminum, a steel type stainless (STS) or magnesium), or a combination of at least two of the materials. The side surface 110C can be formed by a side bezel structure (or "side member") 118 coupled with the front plate 102 and the back plate 111 and including a metal and/or polymer. In some embodiment, the back plate 111 and the side bezel structure 118 can be integrally formed and can include the same material (e.g., a metallic material such as aluminum).

In an illustrated embodiment, the front plate 102 can include, at both ends of a long edge of the front plate 102, two first regions 110D which are bent from the first surface 110A toward the back plate 111 and are extended seamlessly. In an illustrated embodiment (referring to FIG. 2), the back plate 111 can include, at both ends of the long edge, two second regions 110E which are bent from the second surface 110B toward the front plate 102 and are extended seamlessly. In some embodiment, the front plate 102 (or the back plate 111) can include only one of the first regions 110D (or the second regions 110E). In another embodiment, some of the first regions 110D or the second regions 110E may not be included. In the embodiments, when viewing from the side of the electronic device 100, the side bezel structure 118 can have a first thickness (or width) at a side not including the first regions 110D or second regions 110E, and have a second thickness thinner than the first thickness at a side including the first regions 110D or second regions 110E.

According to an embodiment, the electronic device 100 can include at least one or more of a display 101, audio modules 103, 107 and 114, sensor modules 104, 116 and 119, camera modules 105, 112 and 113, a key input device 117, a light emitting element 106 or connector holes 108 and 109. In some embodiment, the electronic device 100 can omit at least one (e.g., the key input device 117 or the light emitting element 106) of the components, or can additionally include another component.

The display 101, for example, can be exposed through a significant portion of the front plate 102. In some embodiment, at least a portion of the display 101 can be exposed through the first surface 110A, and the front plate 102 forming the first regions 110D of the side surface 110C. In some embodiment, an edge of the display 101 can be formed commonly identically with an adjacent outer shape of the front plate 102. In another embodiment (not shown), to extend an area in which the display 101 is exposed, an interval between the outer of the display 101 and the outer of the front plate 102 can be formed commonly identically.

In another embodiment (not shown), a recess or opening can be formed in a portion of a screen display region of the display 101, and at least one or more of the audio module 114, the sensor module 104, the camera module 105, and the light emitting element 106 which are aligned with the recess or the opening can be included. In another embodiment (not shown), at least one or more of the audio module 114, the sensor module 104, the camera module 105, the fingerprint scanning sensor 116, and the light emitting element 106 can be included in a rear surface of the screen display region of the display 101. In another embodiment (not shown), the display 101 can be coupled with or be arranged adjacently with a touch sensing circuit, a pressure sensor capable of measuring a touch strength (pressure), and/or a digitizer obtaining a magnetic-type stylus pen. In some embodiment, at least some of the sensor modules 104 and 119 and/or at least some of the key input device 117 can be arranged in the first regions 110I) and/or the second regions 110E.

The audio modules 103, 107 and 114, for example, can include a microphone hole 103 and speaker holes 107 and 114. A microphone for acquiring an external sound can be arranged within the microphone hole 103. In some embodiment, a plurality of microphones can be arranged to obtain a direction of sound. The speaker holes 107 and 114 can include an external speaker hole 107 and a call receiver hole 114. In some embodiment, the speaker holes 107 and 114 and the microphone hole 103 can be implemented as one hole, or a speaker can be included without the speaker holes 107 and 114 (e.g., a piezo speaker).

The sensor modules 104, 116 and 119, for example, can provide an electric signal or data value which corresponds to an operational state of the electronic device 100 or an environmental state external to the electronic device 101. The sensor modules 104, 116 and 119, in an embodiment, can include a first sensor module 104 (e.g., a proximity sensor) and/or a second sensor module (not shown) (e.g., a fingerprint scanning sensor) which are arranged in the first surface 110A of the housing 110, and/or a third sensor module 119 (e.g., an FIRM sensor) and/or a fourth sensor module 116 (e.g., a fingerprint scanning sensor) which are arranged in the second surface 110B of the housing 110. The fingerprint scanning sensor can be arranged in the second surface 110B as well as the first surface 110A (e.g., the display 101) of the housing 110. The electronic device 100 can further include at least one of sensor modules not shown, for example, a gesture sensor, a gyro sensor, a barometer, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112 and 113, for example, can include a first camera device 105 arranged in the first surface 110A of the electronic device 100, and a second camera device 112 arranged in the second surface 110B, and/or a flash 113. The camera devices 105 and 112 can include one or a plurality of lenses, an image sensor, and/or an image signal processor. The flash 113, for example, can include a light emitting diode or a xenon lamp. In some embodiment, two or more lenses (infrared camera, wide-angle and telephoto lenses) and image sensors can be arranged in one surface of the electronic device 100.

The key input device 117, for example, can be arranged in the side surface 110C of the housing 110. In another embodiment, the electronic device 100 may not include some or all of the above-mentioned key input devices 117, and a key input device 117 not included can be implemented on the display 101 in another form such as a soft key, etc. In some embodiment, the key input device 117 can include the sensor module 116 arranged in the second surface 110B of the housing 110.

The light emitting element 106, for example, can be arranged in the first surface 110A of the housing 110. The light emitting element 106, for example, can offer state information of the electronic device 100 in a light form. In another embodiment, the light emitting element 106, for example, can offer a light source interacting with an operation of the camera module 105. The light emitting element 106, for example, can include an LED, an IR LED and a xenon lamp.

The connector holes 108 and 109, for example, can include a first connector hole 108 capable of accepting a connector (for example, a USB connector) for transmitting and/or receiving power and/or data with an external electronic device, and/or a second connector hole (for example, an earphone jack) 109 capable of accepting a connector for transmitting and/receiving an audio signal with the external electronic device.

Figure 3:
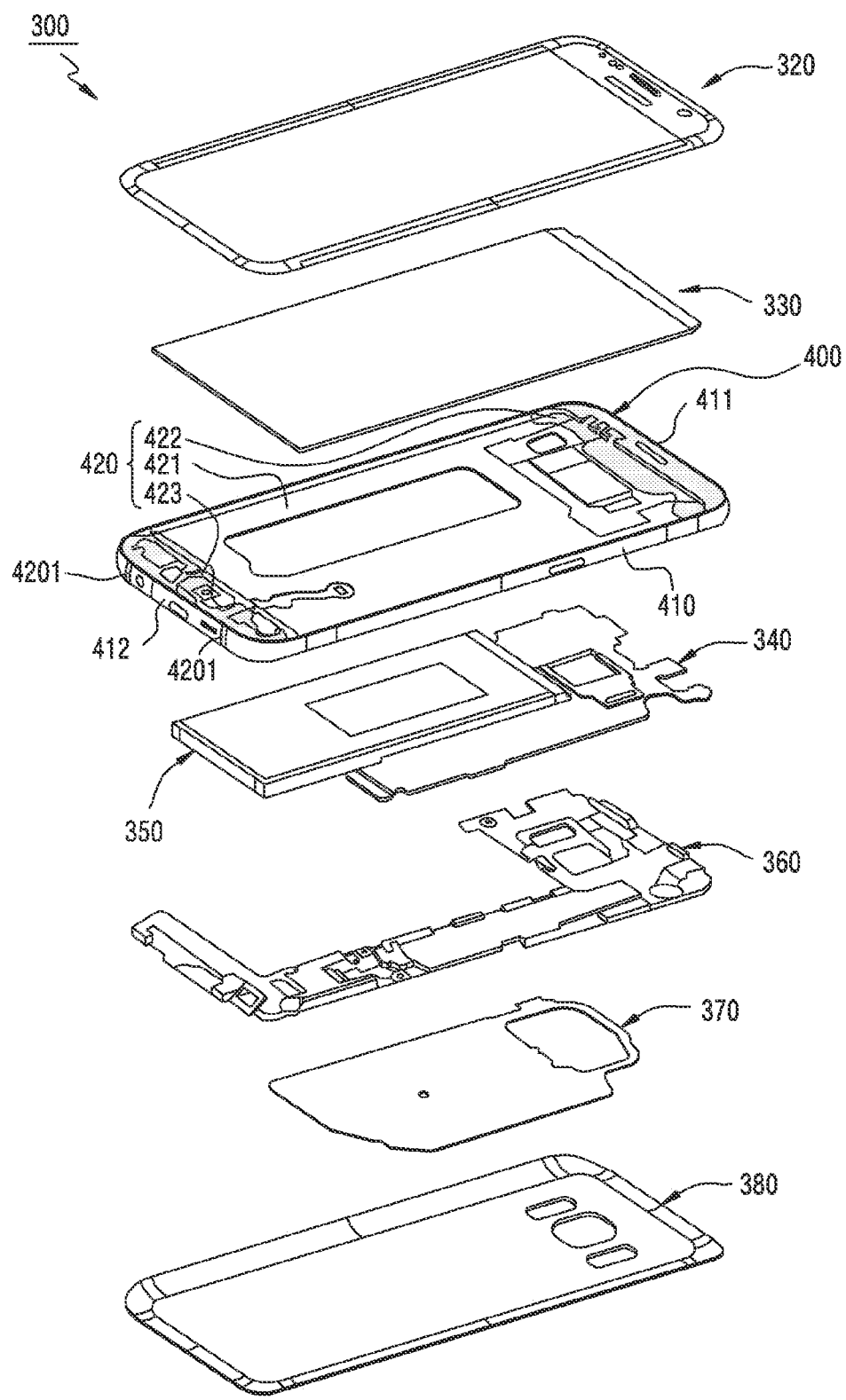
FIG. 3 is an exploded perspective view of the electronic device of FIG. 1 according to an embodiment.
Figure 4:
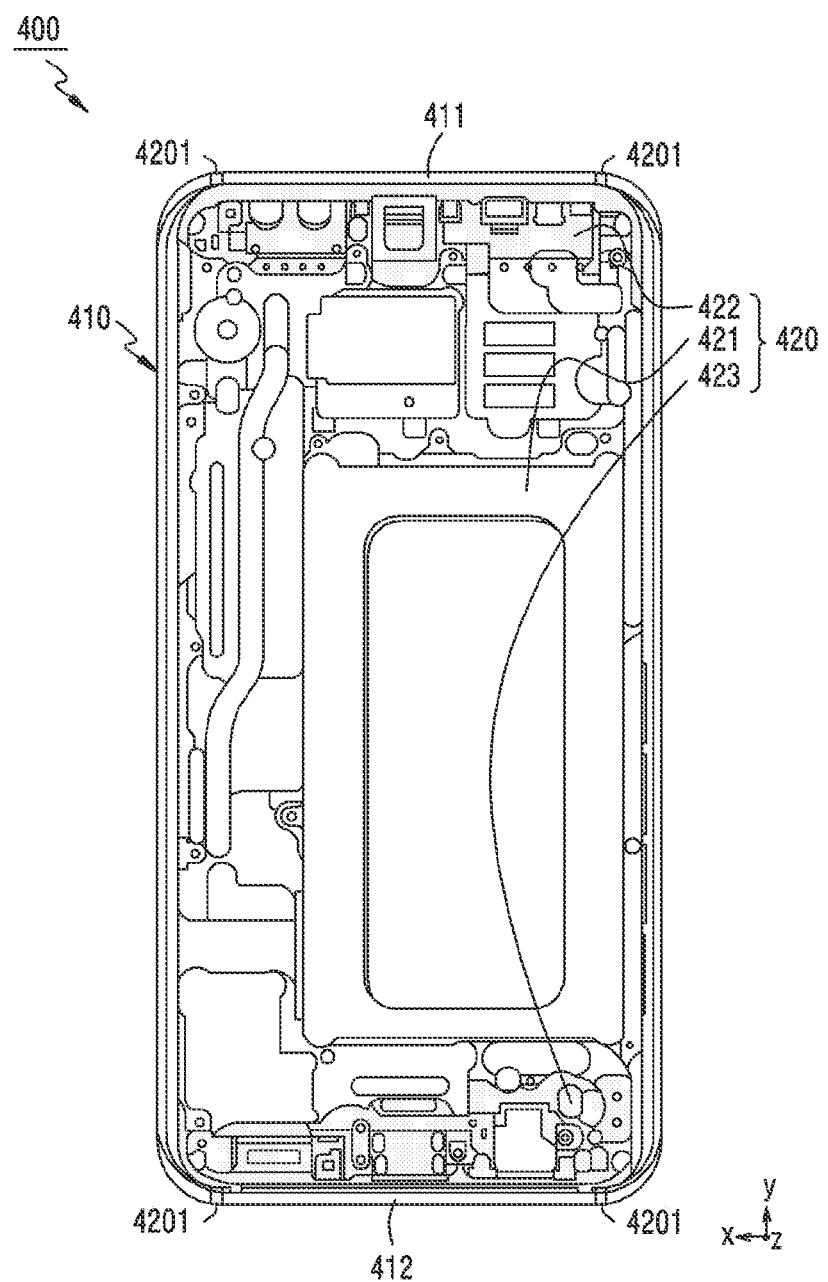
FIG. 4 illustrates a member including a side bezel structure and an inner structure according to an embodiment.

FIG. 3 is an exploded perspective view of the electronic device of FIG. 1 according to an embodiment. FIG. 4 illustrates a member including a side bezel structure and an inner structure according to an embodiment.

Referring to FIG. 3, the electronic device 300 can include at least one of a member 400 consisting of a side bezel structure (or an outer structure) 410 and an inner structure (or a first support member) 420 (e.g., a bracket), a front plate 320, a display 330, a printed circuit board 340, a battery 350, a second support member 360 (e.g., a rear case), an antenna 370, and a back plate 380. In some embodiment, the electronic device 300 can omit at least one (e.g., the second support member 360) of the components or additionally include another component. At least one of the components of the electronic device 300 can be identical to or similar with at least one of the components of the electronic device 100 of FIG. 1 or FIG. 2, and a repeated description is omitted below.

Referring to FIG. 3 and FIG. 4, in an embodiment, the side bezel structure 410 is a form of surrounding a space between the front plate 320 and the back plate 380, and the inner structure 420 can be coupled with the side bezel structure 410 and be arranged in the space. According to an embodiment, the side bezel structure 410 can be formed of a metallic material. According to some embodiment, the side bezel structure 410 can be formed of a non-metallic material as well.

According to an embodiment, the inner structure 420 can be arranged within the electronic device and be connected with the side bezel structure 410. The inner structure 420, for example, can be formed of a metallic material and/or a non-metallic (e.g., polymeric) material. The inner structure 420 can be coupled, at one surface, with the display 330, and be coupled, at the other surface, with the printed circuit board 340.

According to an embodiment, the inner structure 420 can include an inner metal structure 421 which can be connected with the side bezel structure 410 or can be formed integrally with the side bezel structure 410. For example, the inner metal structure 421 can include the same metallic material as the side bezel structure 410. For another example, the inner metal structure 421 can include a different metallic material from the side bezel structure 410.

According to an embodiment, the inner structure 420 can include one or more inner non-metal structures 422 and 423 which include a polymeric material coupled with the side bezel structure 410 and the inner metal structure 421. According to an embodiment, the one or more inner non-metal structures 422 and 423 can allow portions 411 and 412 of the side bezel structure 410 to be maintained in a state of being physically or electrically separated from the remnant portions (not shown) of the side bezel structure 410.

According to an embodiment, portions 4201 of the one or more inner non-metal structures 422 and 423 can be arranged in gaps (or slits) (not shown) of the side bezel structure 410 and be exposed to the external. For example, the portions 4201 of the one or more inner non-metal structures 422 and 423 can form a side surface (e.g., the side surface 110C of FIG. 1) of the electronic device 300, together with the side bezel structure 410.

According to an embodiment, the portions 411 and 412 of the side bezel structure 410 can be electrically connected to the printed circuit board 340 and be used as an antenna element. For example, the portions 411 and 412 of the size bezel structure 410 can be used as an antenna radiator or an antenna ground. According to some embodiment, the portions 411 and 412 of the side bezel structure 410 can be in an electrically floating state.

According to an embodiment, the member 400 consisting of the side bezel structure 410 and the inner structure 420, for example, can be formed by putting a metal structure (not shown) in a mold and then, injecting a polymeric material of a molten state to form a hybrid structure in which a non-metal structure (not shown) is bonded to the metal structure and then, post processing (e.g., external form processing such as cutting, and a surface treatment such as polishing and anodizing) the hybrid structure. The side bezel structure 410 and the inner metal structure 421 can be formed from the metal structure, and the one or more inner non-metal structures 422 and 423 can be formed from the non-metal structure of a polymeric material molded through injection.

The quality of a hybrid structure in which a non-metal structure of a polymeric material is bonded to a metal structure through injection, for example, can be different according to various molding conditions (e.g., a pressure, a speed, a position, a time or a temperature) on the injection. For example, in response to a mold temperature being decreased unintentionally, there can be an appearance fault such as a weld line, carbonization, and a black spot in the non-metal structure, or there can be a bonding fault (e.g., a crack) between the metal structure and the non-metal structure. For example, in response to a temperature of a molten resin being lower than or being higher than a set temperature, there can be a fault in filling of the molten resin within a mold. According to an embodiment, the metal structure is a plate-shaped metal structure including a first surface and a second surface, and can include at least one opening penetrating the first surface and the second surface, and at least one recess having a first depth from the first surface and being extended to have a repeating pattern selected from among a W-shape, a sawtooth shape or a straight line shape when viewing from above the first surface. According to an embodiment, after the hybrid structure in which the non-metal structure of the polymeric material is bonded to the metal structure through injection is formed, an injection quality or injection defect can be determined by checking how much polymeric material is filled in the at least one recess. According to an embodiment, a pattern of the at least one recess can include a scale, and how much polymeric material is filled in the at least one recess can be quantitatively checked through the scale. For example, in response to injection being carried out in a set molding condition (e.g., a pressure, a speed, a position, a time or a temperature), the polymeric material can be filled by a set quantity in the at least one recess. For example, in response to the injection not being carried out in the set molding condition, the polymeric material is filled less than a set quantity in the at least one recess, or may not be filled in some case. According to some embodiment, in place of the at least one recess formed in the metal structure, a set molding space between an inner surface of a mold and the first surface of the metal structure can be prepared, and an injection quality or injection defect can be determined by checking how much polymeric material is filled in this set molding space as well.

The printed circuit board 340, for example, can mount a processor, a memory, and/or an interface. The processor, for example, can include one or more of a central processing device, an application processor, a graphic processing device, an image signal processor, a sensor hub processor, or a communication processor.

The memory, for example, can include a volatile memory or a non-volatile memory.

The interface, for example, can include a high definition multimedia interface (HDMI), a universal serial bus (USB) interface, an SD card interface, and/or an audio interface. The interface, for example, can electrically or physically connect the electronic device 300 with an external electronic device, and can include a USB connector, an SD card/MMC connector, or an audio connector.

The battery 350 is a device for supplying power to at least one component of the electronic device 300 and, for example, can include a non-rechargeable primary cell, a rechargeable secondary cell, or a fuel cell. At least a portion of the battery 350, for example, can be arranged on the substantially same plane as the printed circuit board 340. The battery 350 can be arranged integrally within the electronic device 300, and can be arranged detachably with the electronic device 300 as well.

The second support member 360, in an embodiment, can be coupled to the inner structure 420, and be arranged between the printed circuit board 340 and the back plate 380. The second support member 360 can be coupled to the inner structure 300 by using bolt joint, together with the printed circuit board 340, and can play a role of covering and protecting the printed circuit board 340. The second support member 360, for example, can be formed of a metallic material and/or a non-metallic (e.g., polymeric) material.

The antenna 370, in an embodiment, can be arranged between the back plate 380 and the battery 350. The antenna 370, for example, can include a near field communication (NEC) antenna, a wireless charging antenna, and/or a magnetic secure transmission (MST) antenna. The antenna 370, for example, can perform short-range communication with an external device, or can wirelessly transmit and/or receive power required for charging. In another embodiment, an antenna structure can be formed by the side bezel structure 410 and/or a portion of the first support member 420 or a combination thereof.

Figure 5:
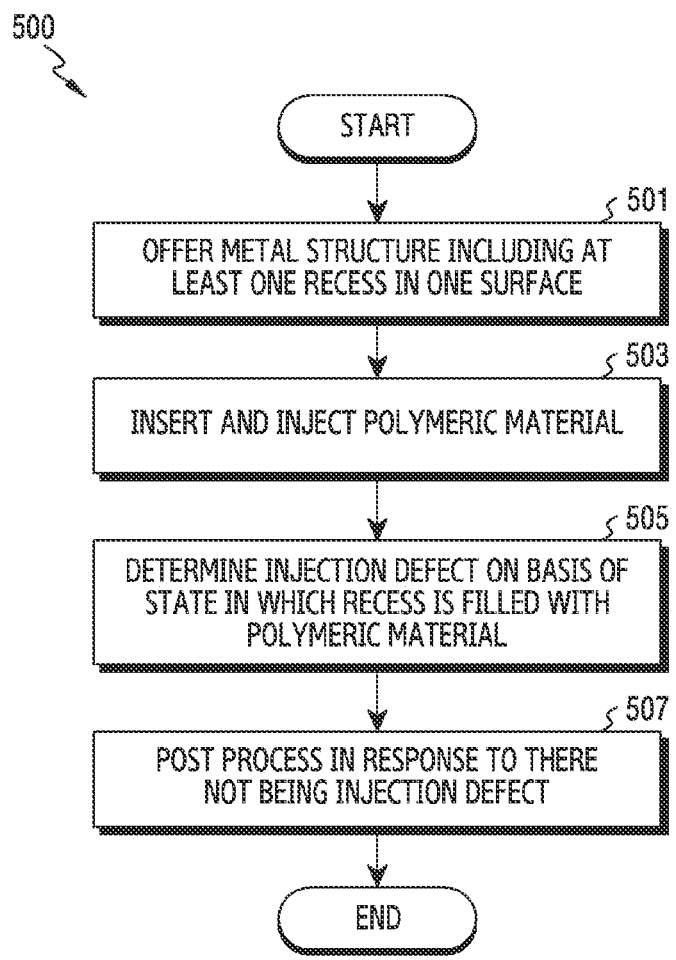
FIG. 5 illustrates a manufacture flow for an electronic device member of a metal structure and a non-metal structure according to an embodiment.
Figure 6A:
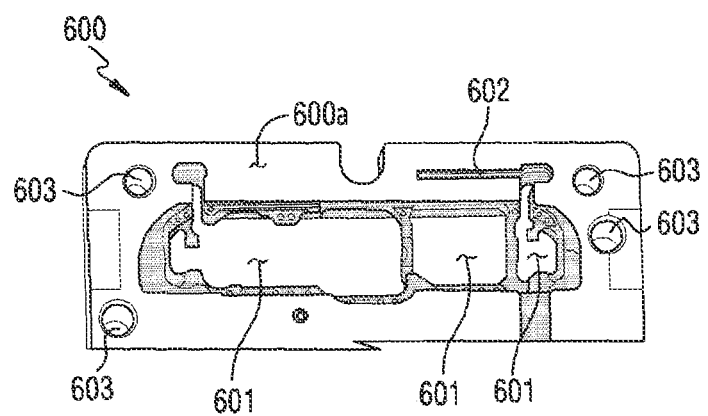
FIGS. 6A, 6B and 7 are diagrams for describing the manufacture flow FIG. 5 according to an embodiment.
Figure 6B:
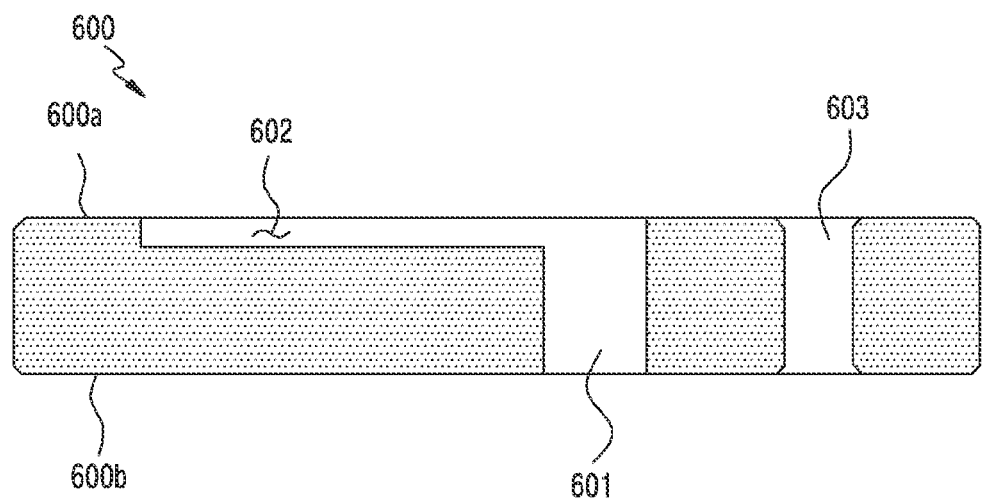
Figure 7:
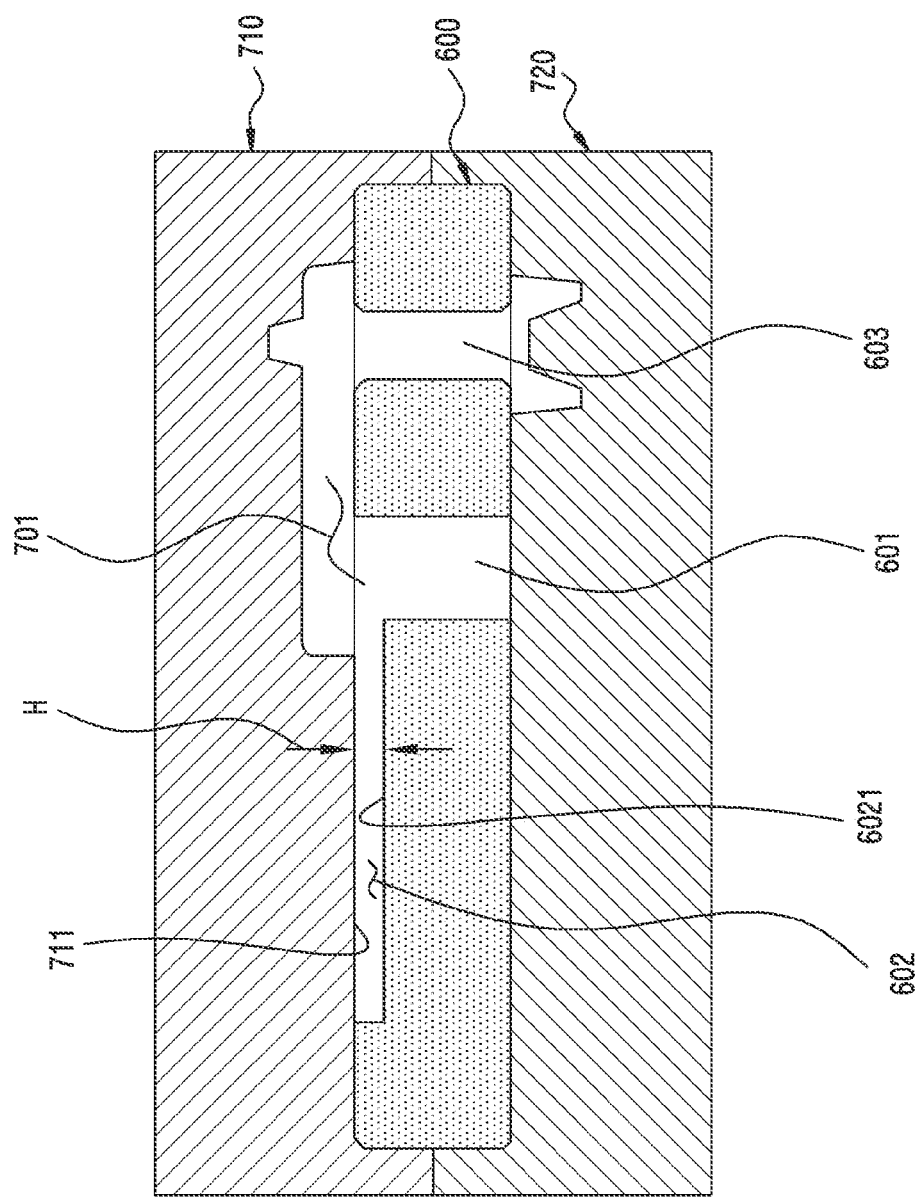

FIG. 5 illustrates a manufacture flow 500 for an electronic device member of a metal structure and a non-metal structure according to an embodiment. FIGS. 6A, 6B and 7 are diagrams for describing the manufacture flow of FIG. 5 according to an embodiment.

Referring to FIG. 5, in an embodiment, in operation 501, a metal structure including at least one recess in one surface can be offered. FIG. 6A illustrates the metal structure according to an embodiment, and FIG. 6B is a section of the metal structure of FIG. 6A. Referring to FIGS. 6A and 6B, the metal structure 600 is a plate-shaped metal structure including a first surface 600a and a second surface 600b, and can include one or more openings (or through-holes) 601 and 603 penetrating the first surface 600a and the second surface 600b. The metal structure 600 can be formed through various processing methods such as computer numerical control (CNC), die casting, or pressing.

According to an embodiment, the metal structure 600 can include at least one recess 602 formed in the first surface 600a. The at least one recess 602 can denote a groove structure of a form of being dug in a direction (not shown)

of going from the first surface 600a to the second surface 600b. According to an embodiment, the recess 602 can have a depth of about 0.3 mm or less from the first surface 600a. According to various embodiments, the recess 602 can be formed at various different depths.

Referring to FIG. 5, in accordance with an embodiment, in operation 503, insert injection can be carried out using a polymeric material. FIG. 7 is a diagram for insert injection according to an embodiment. Referring to FIG. 7, after the metal structure 600 is put between molds 710 and 720, a polymeric material of a molten state can be injected. Between the molds 710 and 720, there is a molding space 701 defining a shape of a non-metal structure bonded to the metal structure 600, and the polymeric material can be injected into this molding space 701. According to an embodiment, the polymeric material can be charged into the one or more openings 601 and 603 of the metal structure 600. After the polymeric material is injected, a hybrid structure in which the metal structure 600 and the non-metal structure (not shown) are bonded can be obtained through cooling solidification and ejecting (e.g., mold separation).

According to various embodiments, a polymeric material used for insert injection can include a polymer resin such as polyether ether ketone (PEEK), polyphenylene sulfide (PPS), polybutylene terephthalate (PBT), polyimide (PI), or polycarbonate (PC).

According to various embodiments, after an organic adhesive layer such as a sealant is coated on the metal structure 600, insert injection can be carried out using a polymeric material. The organic adhesive layer can enhance a bonding strength between the metal structure 600 and the polymeric material. For example, the organic adhesive layer can include triazine thiol, dithio pyrimidine, or a sealane based compound.

The injection quality of a hybrid structure in which a non-metal structure of a polymeric material is bonded to the metal structure 600, for example, can be different according to various molding conditions (e.g., a pressure, a speed, a position, a time or a temperature) on injection. For example, in response to a temperature of the mold 710 or 720 being decreased unintentionally, there can be an appearance fault such as a weld line, carbonization, and a black spot in the non-metal structure, or there can be a bonding fault (e.g., a crack) between the metal structure 600 and the non-metal structure. For example, in response to a temperature of a molten resin being lower or higher than a set temperature, there can be a fault in filling of the molten resin within the molds 710 and 720.

Referring to FIG. 5, in operation 505, an injection defect can be determined on the basis of a state in which the recess is filled with the polymeric material. Referring to FIG. 7, in an embodiment, the mold 710 can include a surface 711 (below, a fourth surface) which forms a portion of the molding space 701 together with a surface 6021 (below, a third surface) of the recess 602. According to an embodiment, the fourth surface 711 of the mold 710 can be formed wherein a space between the third surface 6021 and the fourth surface 711 is substantially consistent with a space (e.g., a space having a depth from the first surface 600a) of the recess 602. According to an embodiment, a height (H) of the space between the third surface 6021 and the fourth surface 711 can be about 0.3 mm or less. According to various embodiments, the space between the third surface 6021 and the fourth surface 711 can be various according to the third surface 6021 and/or the fourth surface 711. According to an embodiment, an injection quality or injection defect can be determined by carrying out an operation of, after forming a hybrid structure in which a non-metal structure of a polymeric material is bonded to the metal structure 600 through insert injection, checking whether the polymeric material is filled in the recess 602, or an operation of checking how much polymeric material is filled in the recess 602. For example, in response to the insert injection not being carried out in a set molding condition, the polymeric material is filled less than a set quantity in the recess 602, or may not be filled in some case. For example, in response to the injection being carried out in the set molding condition, the polymeric material can be filled by the set quantity or more in the recess 602. According to an embodiment, since an injection quality or injection defect difficult to be determined after the hybrid structure in which the non-metal structure is bonded to the metal structure through the injection is formed can be determined, an injection-defective hybrid structure can be sorted out prior to post processing and thus, a cost and time loss can be decreased.

Referring to FIG. 6A, in an embodiment, when viewing from above the first surface 600a, at least one recess 602 can be extended to have a pattern in which a straight line shape is repeated. According to various embodiments, the at least one recess can be formed in various other shapes. For example, when viewing from above the first surface 600a, the at least one recess can be extended to have a pattern in which a W-shape or sawtooth shape is repeated as well.

According to an embodiment, the recess 602 is connected with the one or more openings 601 and 603, and this can enhance a relationship with an injection quality or injection defect of the one or more openings 601 and 603 arranging a considerable portion of the non-metal structure which will be formed through the injection. According to some embodiments, the recess 602 can be prepared in order not to be connected with the one or more openings 601 and 603 as well. For example, in response to the recess 602 and the one or more openings 601 and 603 not being connected, a polymeric material can be difficult to be floated between the recess 602 and the one or more openings 601 and 603 at injection.

According to various embodiments, the recess 602 can be arranged in consideration of the number and/or positions of gates of the molds 710 and 720. For example, in order to enhance the accuracy of the injection quality or injection defect, the recess 602 can be arranged at a set spaced distance from the gates of the molds 710 and 720.

Referring to FIG. 5, in operation 507, in response to it being determined that there is not the injection defect in operation 505, the hybrid structure in which the non-metal structure of the polymeric material is bonded to the metal structure 600 can be post processed. According to an embodiment, the post processing can include external form processing (e.g., cutting based on CNC) for making the hybrid structure into an external form such as the member 400 of FIG. 4. According to an embodiment, the post processing can include an operation of cutting the metal structure 600 in order to eliminate the recess 602 filled with the polymeric material. According to various embodiments, the post processing can include a surface treatment such as polishing, depositing, coating or anodizing, after the external form processing.

FIGS. 8A, 8B, 8C, 8D, 8E and 8F illustrate various forms of a recess prepared in a metal structure according to various embodiments.

Figure 8A:
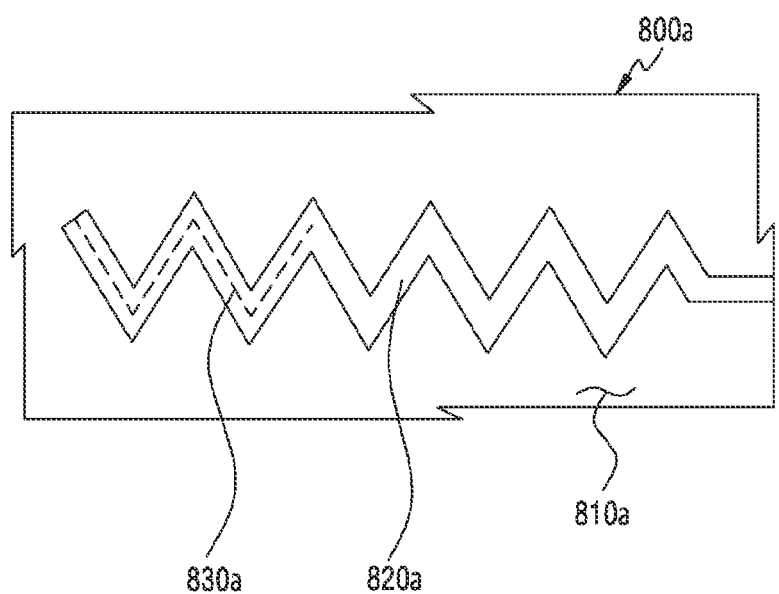
FIGS. 8A, 8B, 8C, 8D, 8E and 8F illustrate various forms of a recess prepared in a metal structure according to various embodiments.
Figure 8B:
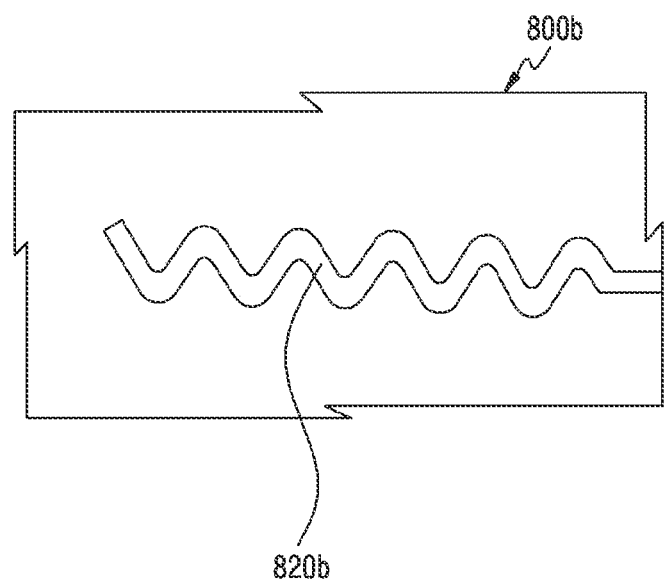
Figure 8C:
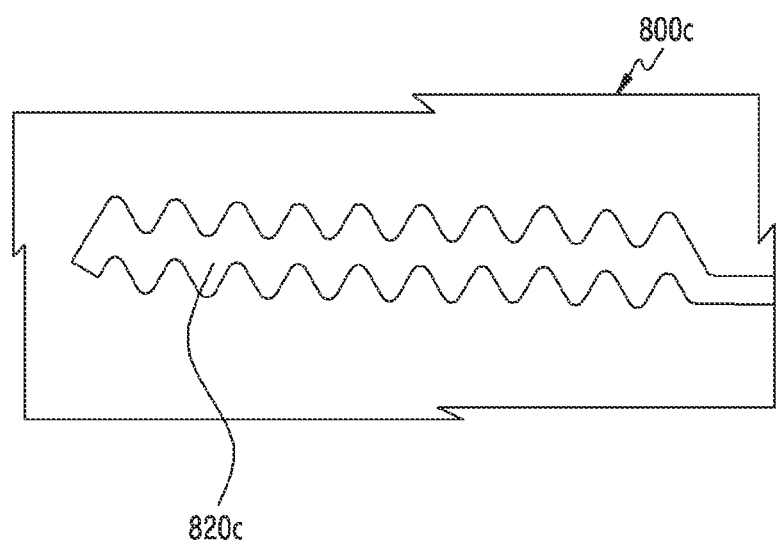

In an embodiment, referring to FIG. 8A, a recess 820a formed in a first surface 810a (e.g., the first surface 600a of FIG. 6A) of a metal structure 800a can be extended to have a pattern of repeating a W-shape 830a, when viewing from above the first surface 810a. In various embodiments, as in FIGS. 8B and 8C, recesses 820b and 820c formed in metal structures 800b and 800c can be extended to have a pattern of repeating a W-shape, and can be extended in a smooth curved shape without angular bending compared to the recess 820a of FIG. 8A. According to an embodiment, the recess 820a, 820b or 820c extending to have the pattern of repeating the W-shape can make it possible to check how much of the recess 820a, 820b or 820c is filled with a polymeric material through insert injection, even without an indicator such as a scale. The recess can be extended to have various other repeating patterns.

Figure 8D:
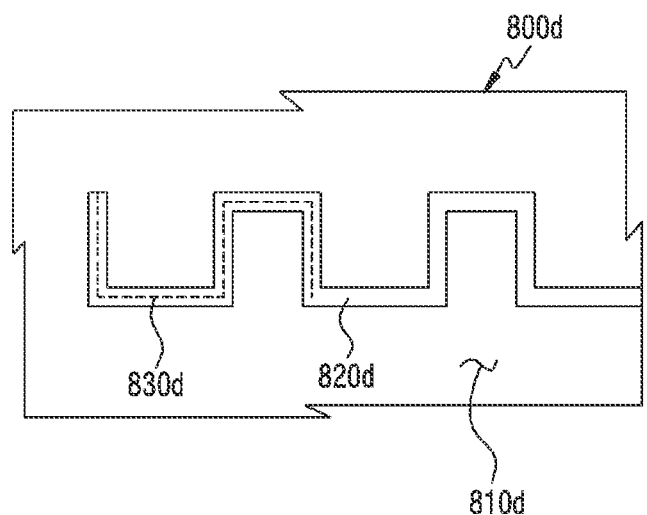

In various embodiments, referring to FIG. 8D, a recess 820d formed in a first surface 810d (e.g., the first surface 600a of FIG. 6A) of a metal structure 800d can be extended to have a pattern of repeating a sawtooth shape 830d, when viewing from above the first surface 810d.

Figure 8E:
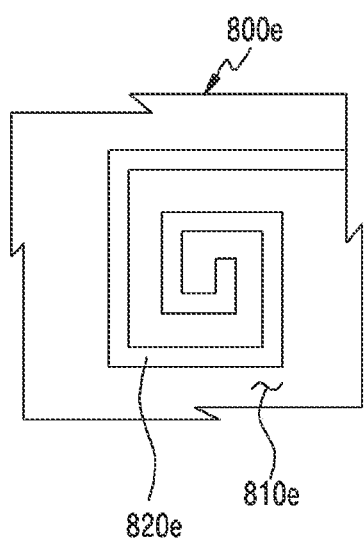

In an embodiment, referring to FIG. 8E, a recess 820e formed in a first surface 810e (e.g., the first surface 600a of FIG. 6A) of a metal structure 800e can be extended in a planar rectangular spiral shape, when viewing from above the first surface 810e.

Figure 8F:
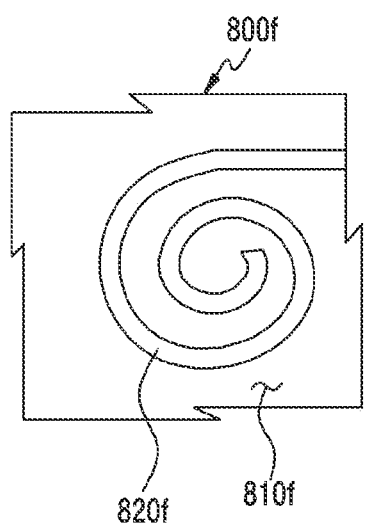

In an embodiment, referring to FIG. 8F, a recess 820f formed in a first surface 810f (e.g., the first surface 600a of FIG. 6A) of a metal structure 800f can be extended in a planar circular spiral shape, when viewing from above the first surface 810f.

According to various embodiments, the recess formed in the metal structure can be implemented to have a pattern of repeating other various shapes.

Figure 9:
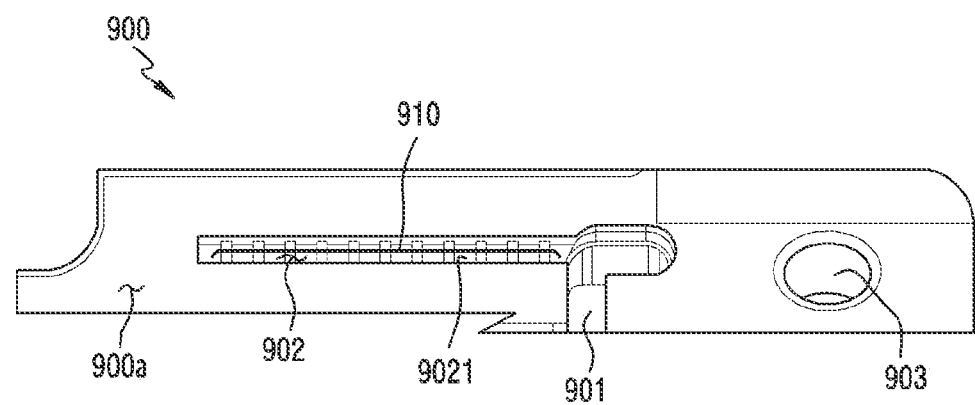
FIG. 9 illustrates a metal structure according to an embodiment.
Figure 10A:
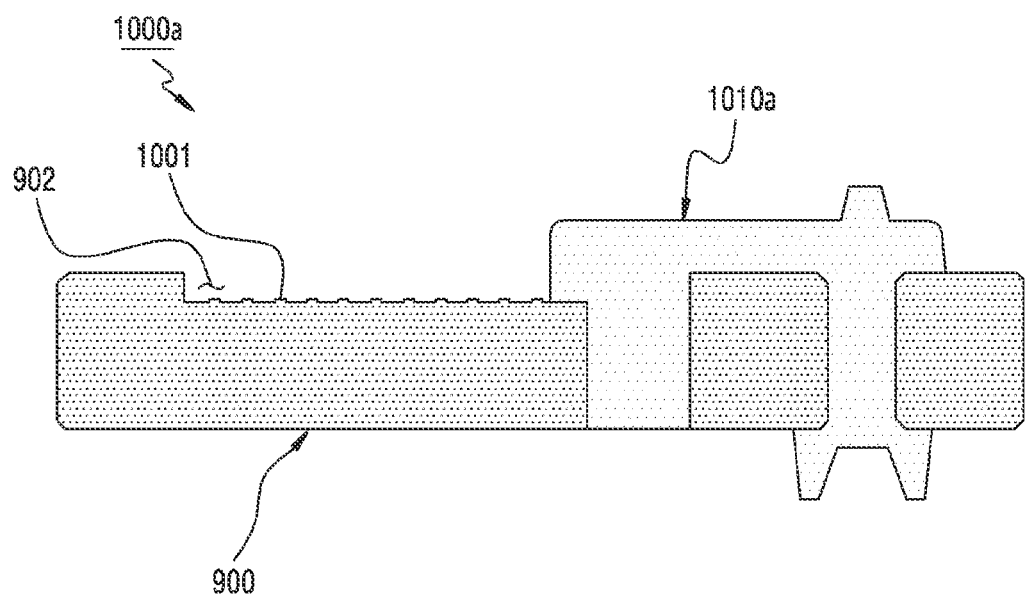
FIGS. 10A and 10B are sections of a hybrid structure formed by insert injecting using the metal structure of FIG. 9 according to an embodiment.
Figure 10B:
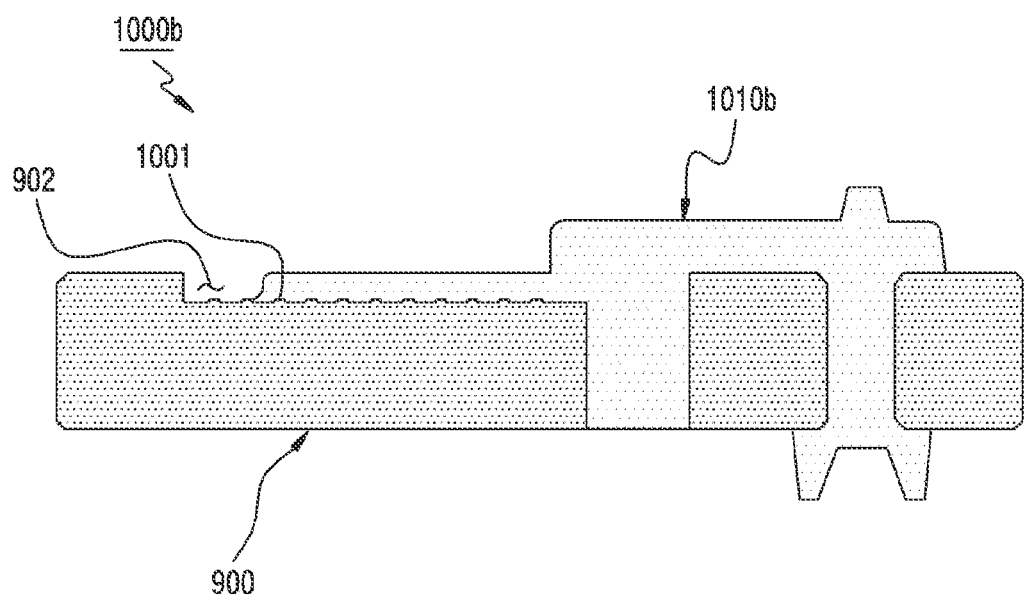

FIG. 9 illustrates a metal structure according to an embodiment. FIGS. 10A and 10B are sections of a hybrid structure formed by insert injecting using the metal structure of FIG. 9 according to an embodiment.

Referring to FIG. 9, in an embodiment, the metal structure 900 is a plate-shaped metal structure, and can include one or more openings 901 and 903 (e.g., one or more openings 601 and 603 of FIG. 6A), and at least one recess 902 (e.g., the recess 602 of FIG. 6A) formed in a first surface 900a (e.g., the first surface 600a of FIG. 6A). According to an embodiment, the at least one recess 902 can be extended to have a pattern of repeating a straight line shape, and the pattern can include a plurality of scales 910.

According to an embodiment, the recess 902 can include a surface 9021 (below, a recess bottom surface) going in the same direction as the first surface 900a, and the plurality of scales 910 can be arranged in the recess bottom surface 9021. According to an embodiment, the plurality of scales 910 can be arranged at specific intervals.

According to an embodiment, the plurality of scales 910 can be implemented as a line-shape protrusion protruded from the recess bottom surface 9021. According to various embodiments (not shown), the plurality of scales 910 can be implemented as a line-shape groove in the recess bottom surface 9021 as well. According to an embodiment, the plurality of scales 910 can be used as an indicator making it possible to quantitatively check how much polymeric material is filled in the recess 902 through injection.

For example, referring to FIG. 10A, a hybrid structure 1000a in which a non-metal structure 1010a is bonded to the metal structure 900 by insert injection can be formed. As illustrated, a polymeric material may not be filled in the recess 902 by a set scale 1001 or more, and there can be a high possibility in which the hybrid structure 1000a has an injection defect.

For example, referring to FIG. 10B, a hybrid structure 1000b in which a non-metal structure 1010b is bonded to the metal structure 900 by insert injection can be formed. As illustrated, a polymeric material can be filled in the recess 902 by the set scale 1001 or more, and there can be a low possibility in which the hybrid structure 1000b has an injection defect.

Figure 11:
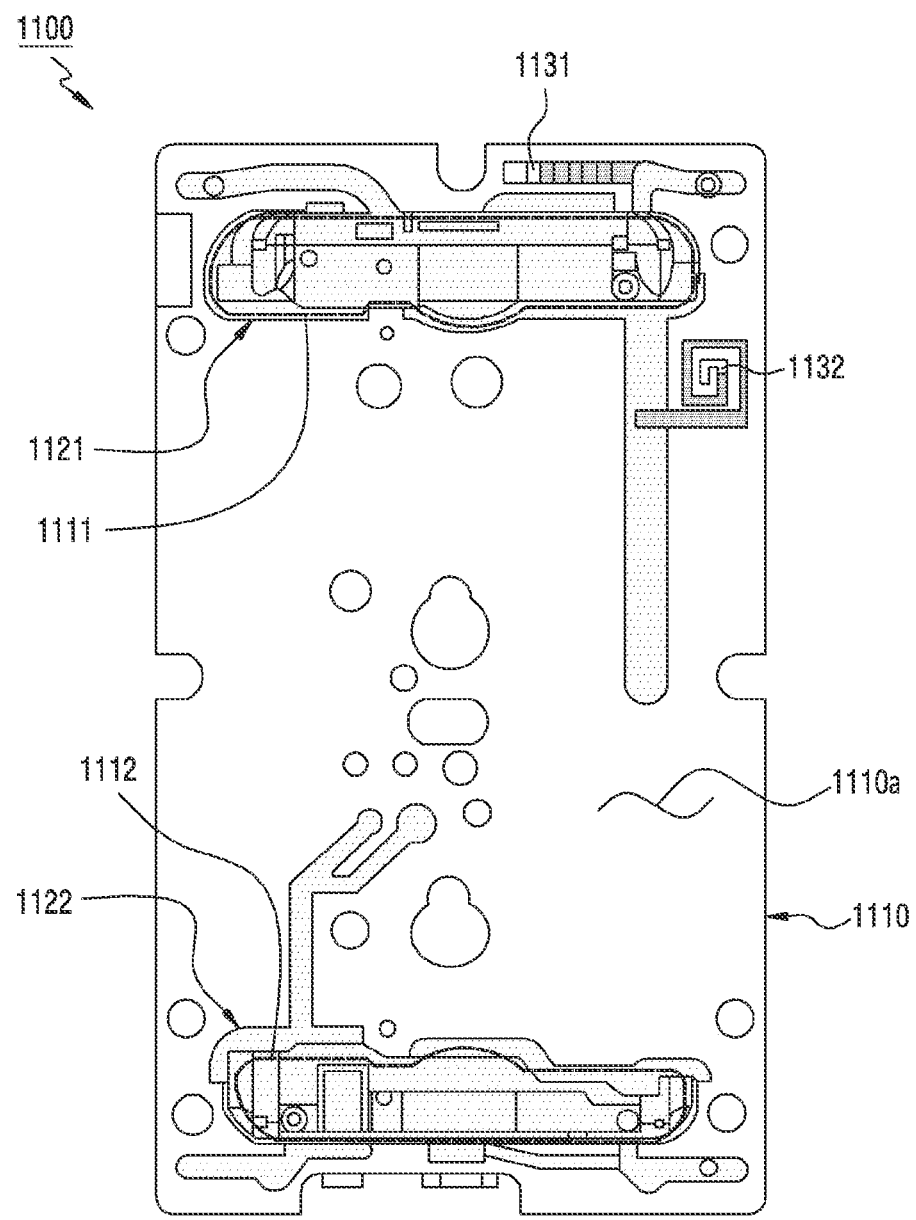
FIG. 11 illustrates a hybrid structure of a metal structure and a non-metal structure according to various embodiments.

FIG. 11 illustrates a hybrid structure 1100 of a metal structure and a non-metal structure according to various embodiments.

Referring to FIG. 11, in an embodiment, the metal structure 1110 can include a first opening 1111 and a second opening 1112. In response to doing insert injection for the metal structure 1110, a first non-metal structure 1121 bonded to the first opening 1111 and a second non-metal structure 1122 bonded to the second opening 1112 can be formed. For example, referring to FIG. 4, the side bezel structure 410 and the inner metal structure 421 can be formed from the metal structure 1110 of FIG. 11, and the inner non-metal structures 422 and 423 can be formed from the first and second non-metal structures 1121 and 1122.

According to an embodiment, the metal structure 1110 can include a first recess 1131 and a second recess 1132 which are formed in a first surface 1110a (e.g., the first surface 600a of FIG. 6A). According to an embodiment, the first recess 1131 and the second recess 1132 can have mutually different shapes. For example, when viewing from above the first surface 1100a, the first recess 1131 can be a straight line shape, and the second recess 1132 can be a planar rectangular spiral shape. According to some embodiment (not shown), the first recess and the second recess can be implemented in a similar or substantially same shape as well.

According to an embodiment, the first recess 1131 and the second recess 1132 can be arranged to be connected with the first opening 1111. According to various embodiments (not shown), the first recess can be implemented to be connected with the first opening 1111, and the second recess can be done to be connected with the second opening 1112 as well. According to various embodiments (not shown), the first recess and the second recess can be implemented to be connected with the second opening 1112 as well. According to various embodiments, the number or positions of recesses can be implemented variously, without being limited to FIG. 11.

According to an embodiment, as illustrated, a polymeric material can be filled in the first recess 1131 by a first scale (not shown) or more set for the first recess 1131. The polymeric material can be filled in the second recess 1132 by a second scale (not shown) or more set for the second recess 1132. This can indicate that there is a low possibility in which the hybrid structure 1100 has an injection defect.

According to various embodiments (not shown), the polymeric material is not filled in the first recess 1131, or can be filled in the first recess 1131 by less than the first scale set for the first recess 1131. According to various embodiments (not shown), the polymeric material is not filled in the second recess 1132, or can be filled in the second recess 1132 by less than the second scale set for the second recess 1132. This can indicate that there is a high possibility in which the hybrid structure 1100 has an injection defect.

Figure 12:
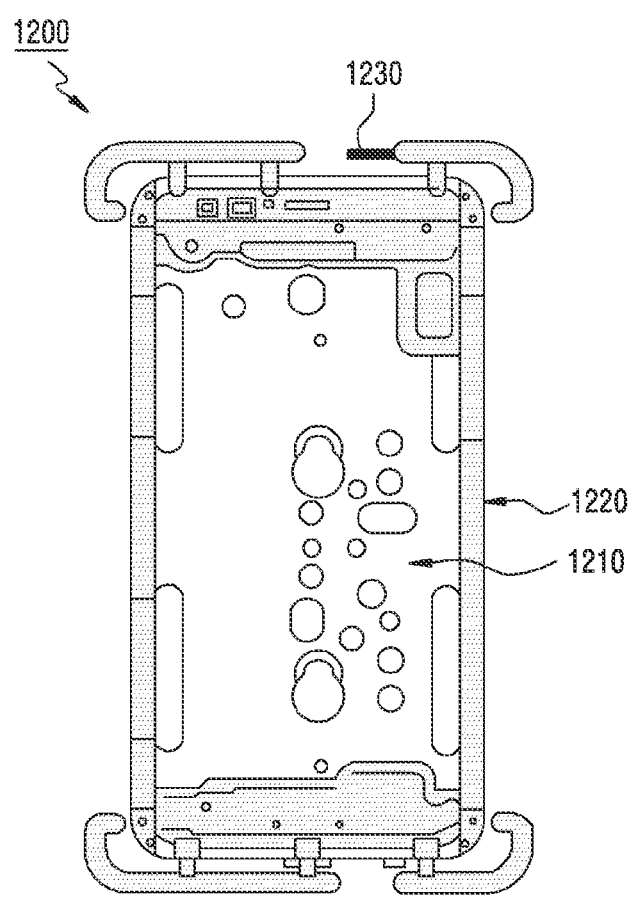
FIG. 12 illustrates a hybrid structure of a metal structure and a non-metal structure according to various embodiments.

FIG. 12 illustrates a hybrid structure 1200 of a metal structure and a no metal structure according to various embodiments.

According to an embodiment, a mold (e.g., the molds 710 and 720 of FIG. 7) can offer a molding space which can be used for injection quality or injection defect determination. For example, in response to injection being carried out in a set molding condition, a polymeric material can be filled by a set amount or more in the molding space, and as illustrated, can be formed as a structure 1230 extended by a set length or more from the non-metal structure 1220. For example, in response to the injection not being carried out in the set molding condition, the polymeric material is not filled in the molding space, or can be filled by less than the set amount in the molding space.

Figure 13:
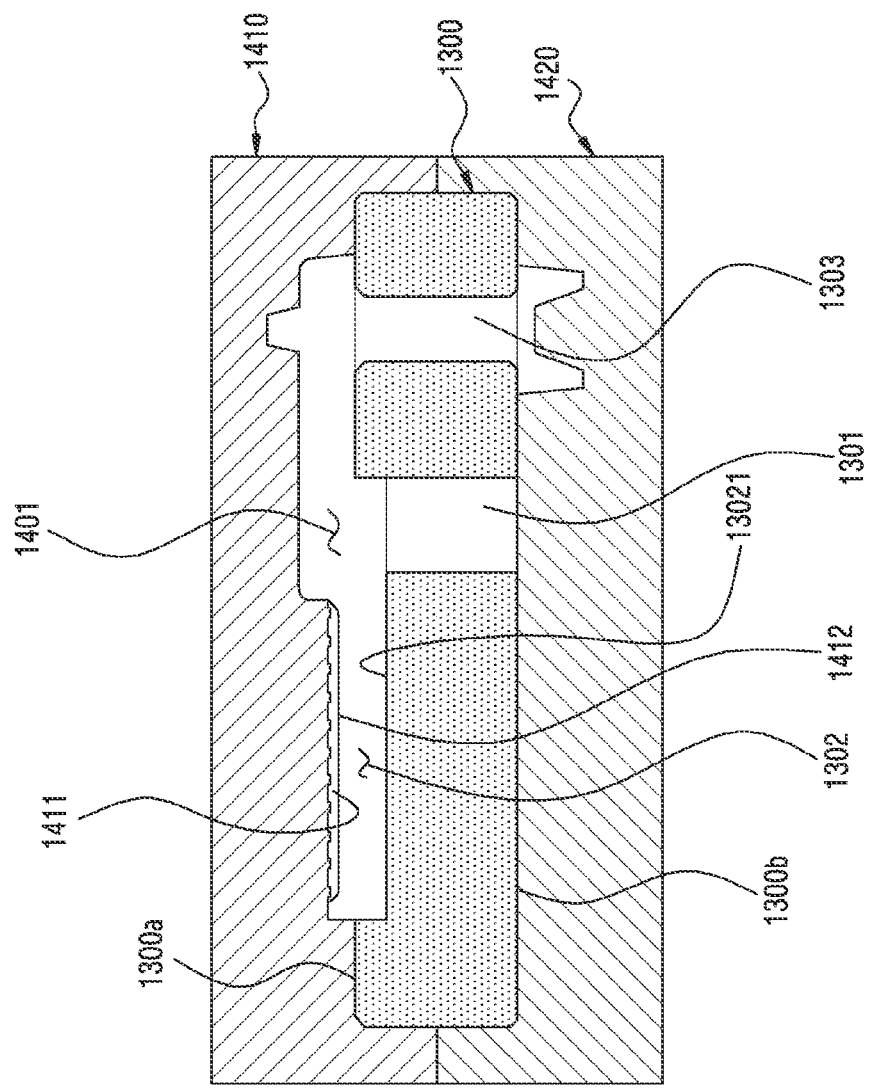
FIG. 13 is a diagram for insert injection according to various embodiments.

FIG. 13 is a diagram for insert injection according to various embodiments. FIGS. 14, 15A, 15B and 15C are diagrams for describing FIG. 13 according to an embodiment.

Referring to FIG. 13, in an embodiment, a metal structure 1300 is a plate-shaped metal structure including a first surface 1300a and a second surface 1300b, and can include one or more openings 1301 and 1303 penetrating the first surface 1300a and the second surface 1300b, and at least one recess 1302 formed in the first surface 1300a. For example, the metal structure 1300 is substantially the same as the metal structure 600 of FIG. 6B and thus, its detailed description is omitted. According to an embodiment, after the metal structure 1300 is put between molds 1410 and 1420, a polymeric material of a molten state can be injected. Between the molds 1410 and 1420, there is a molding space 1401 defining a shape of a non-metal structure bonded to the metal structure 1300, and the polymeric material can be injected into this molding space 1401. After the polymeric material is injected, a hybrid structure in which the metal structure 1300 and the non-metal structure (not shown) are bonded can be obtained through cooling solidification and ejecting.

According to an embodiment, the mold 1410 can include a surface 1411 (below, a fourth surface) which forms a portion of the molding space 1401 together with a surface 13021 (third surface) of the recess 1302 of the metal structure 1300. According to an embodiment, the fourth surface 1411 can include a plurality of scales 1412. The plurality of scales 1412, for example, can be implemented as a line-shape protrusion protruded from the fourth surface 1411. According to various embodiments (not shown), the plurality of scales 1412 can be implemented as a line-shape groove in the fourth surface 1411 as well. According to an embodiment, the plurality of scales 1412 can be arranged at specific intervals.

Figure 14:
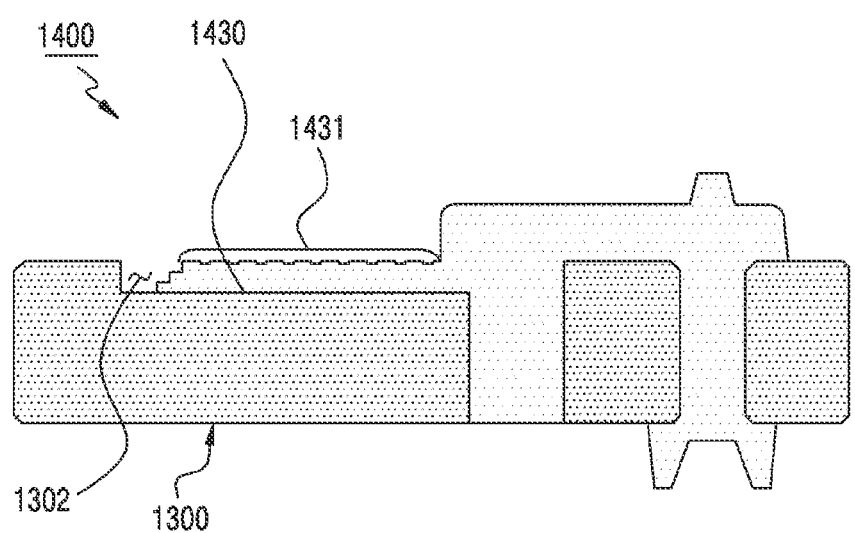
FIGS. 14, 15A, 15B and 15C are diagrams for describing FIG. 13 according to an embodiment.

Referring to FIGS. 13 and 14, a structure (or a polymer structure) 1430 of a polymeric material formed in the recess 1302 through insert injection can be extended to have a corresponding number of scales 1431 engraved by the scales 1412 of the mold 1410 correspondingly to an amount of the polymeric material filled in the recess 1302.

According to an embodiment, in response to injection being carried out in a set molding condition, the structure 1430 of the polymeric material formed in the recess 1302 can have a set number of scales 1431 or more. This can indicate that there is a low possibility in which the hybrid structure 1400 has an injection defect. According to an embodiment (not shown), in response to the injection not being carried out in the set molding condition, the structure of the polymeric material formed in the recess 1302 can have a smaller number of scales than the set number. This can indicate that there is a high possibility in which the hybrid structure has the injection defect.

Figure 15A:
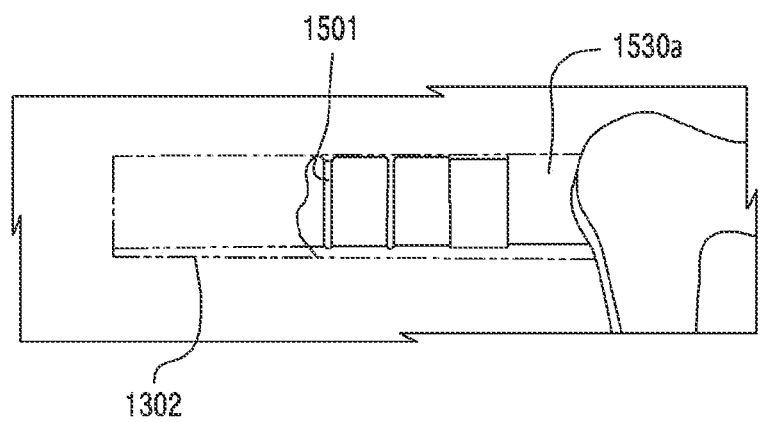
Figure 15B:
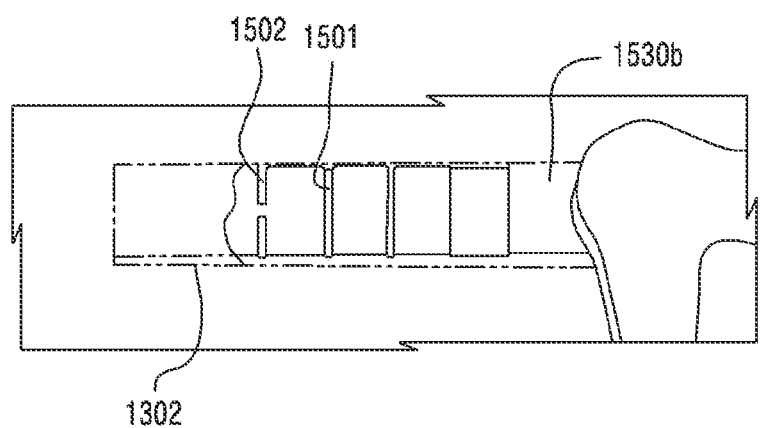
Figure 15C:
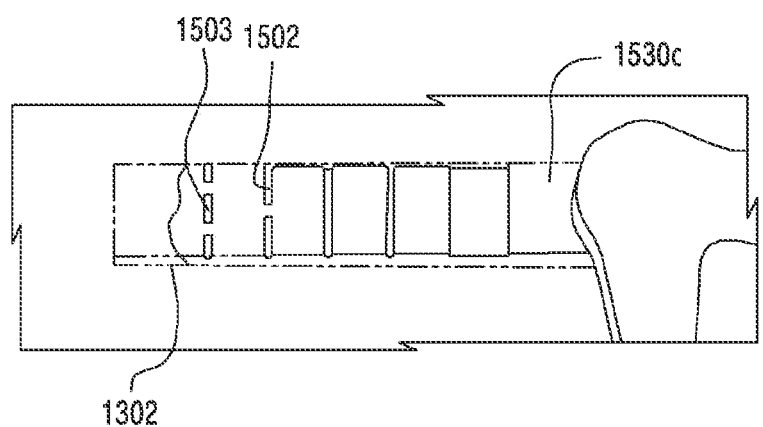

Referring to FIG. 13, in various embodiments, at least some of the plurality of scales 1412 of the mold 1410 can be formed in mutually different forms as well. Referring to FIGS. 15A, 15B and 15C, a structure 1530a, 1530b or 1530c of a polymeric material formed in the recess 1302 through insert injection can be extended to have a corresponding number of scales engraved by the scales 1412 of the mold 1410 correspondingly to an amount of the polymeric material filled in the recess 1302.

For example, in FIG. 15A, in response to the structure 1530a of the polymeric material formed in the recess 1302 being extended to have a scale 1501 of a first shape, this can indicate that injection was conducted in a state (e.g., about 100° C.) in which a temperature of a mold is lower than a set temperature.

For example, in FIG. 15B, in response to the structure 1530b of the polymeric material formed in the recess 1302 being more extended to have a scale 1502 of a second shape next to the scale 1501 of the first shape, this can indicate that the injection was conducted in a state (e.g., about 125° C.) in which the temperature of the mold is lower than the set temperature.

For example, in FIG. 15C, in response to the structure 1530c of the polymeric material formed in the recess 1302 being more extended to have a scale 1503 of a third shape next to the scale 1502 of the second shape, this can indicate that the injection was conducted in a state (e.g., about 159° C.) in which the temperature of the mold is equal to the set temperature.

Figure 16A:
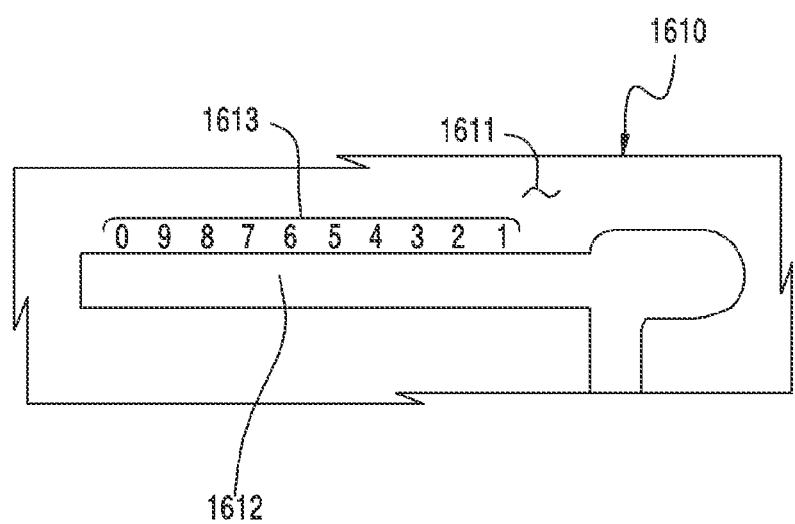
FIGS. 16A and 16B illustrate metal structures according to various embodiments.
Figure 16B:
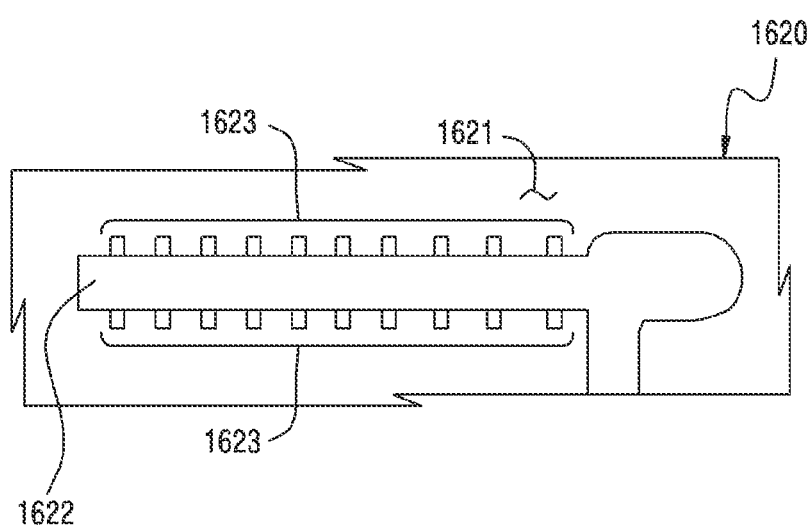

FIGS. 16A and 16B illustrate metal structures according to various embodiments.

Referring to FIG. 16A, in an embodiment, the metal structure 1610 can include Arabic numerals 1613 engraved in a first surface 1611 along a recess 1612. For example, in response to it being checked that a polymeric material is extended to a position of a numeral '6' or more and is filled in the recess 1612 after insert injection, this can indicate that there is a low possibility of an injection defect. According to various embodiments, in place of the numerals 1613, Roman numerals and/or alphabets can be engraved. Referring to FIG. 16B, in an embodiment, the metal structure 1620 can include scales 1623 engraved in a first surface 1621 along a recess 1622. According to various embodiments, other various identifiers can be used.

Figure 17:
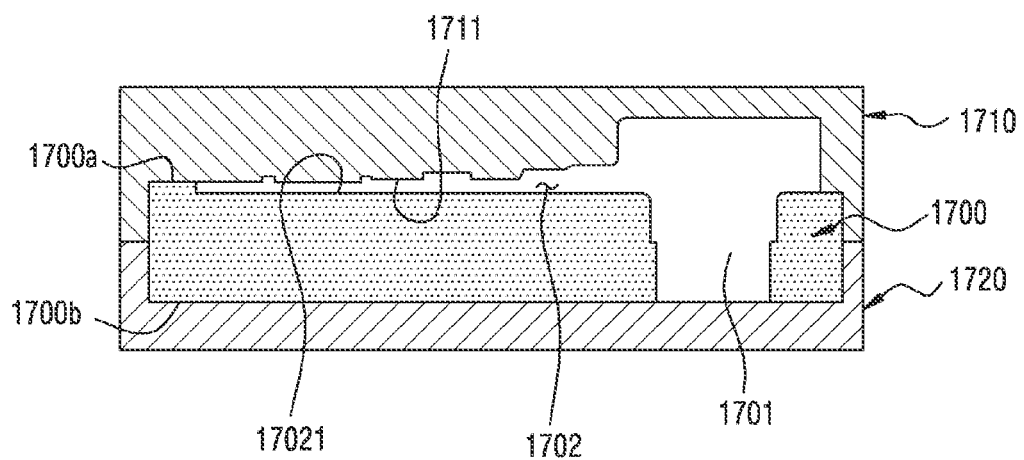
FIG. 17 is a diagram for insert injection according to an embodiment.

FIG. 17 is a diagram for insert injection according to an embodiment.

Referring to FIG. 17, in an embodiment, a metal structure 1700 is a plate-shaped metal structure including a first surface 1700a and a second surface 1700b, and can include at least one opening 1701 penetrating the first surface 1700a and the second surface 1700b, and at least one recess 1702 formed in the first surface 1700a. The metal structure 1700 is substantially the same as the metal structure 600 of FIG. 6B and thus, its detailed description is omitted. According to an embodiment, at insert injection, after the metal structure 1700 is put between molds 1710 and 1720, a polymeric material of a molten state can be injected.

According to an embodiment, the mold 1710 can include a fourth surface 1711 (e.g., the fourth surface 711 of FIG. 7) which faces a third surface 17021 (e.g., the third surface 6021 of FIG. 7) of the recess 1702 of the metal structure 1700. According to an embodiment, when viewing from a section, a space between the third surface 17021 and the fourth surface 1711 can be implemented by a structure which is connected with the opening 1701 and whose width or height increases as it goes to the opening 1701. According to an embodiment, this structure can allow a polymeric material to be floated in the space between the third surface 17021 and the fourth surface 1711 sensitively to a temperature among molding conditions on injection. The above structure, for example, can be used for evaluating an injection quality caused by a mold temperature.

Figure 18:
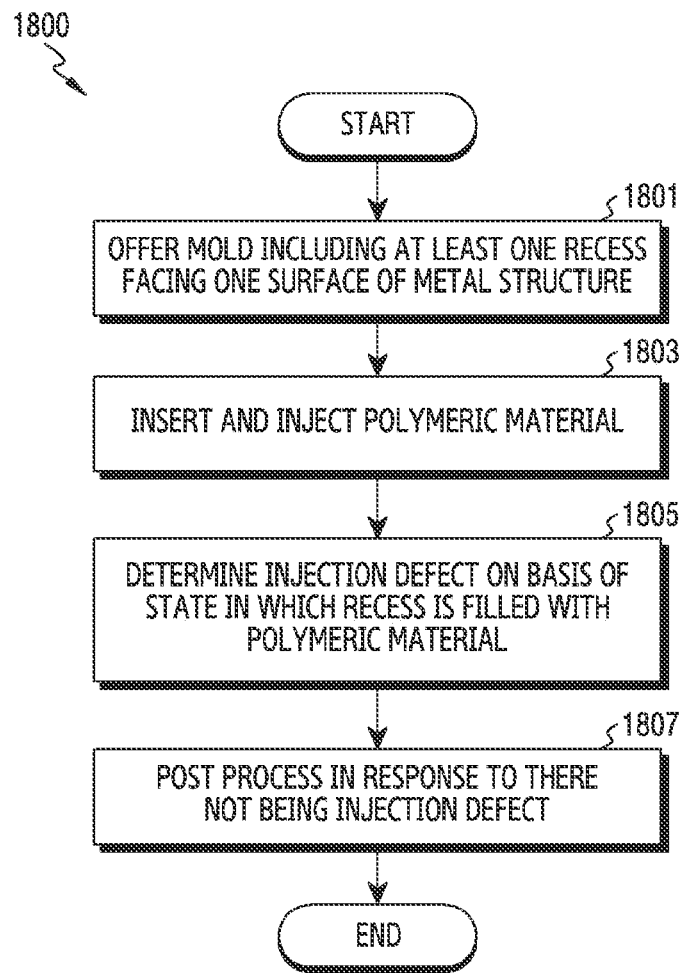
FIG. 18 illustrates a manufacture flow for an electronic device member of a metal structure and a non-metal structure according to an embodiment.
Figure 19:
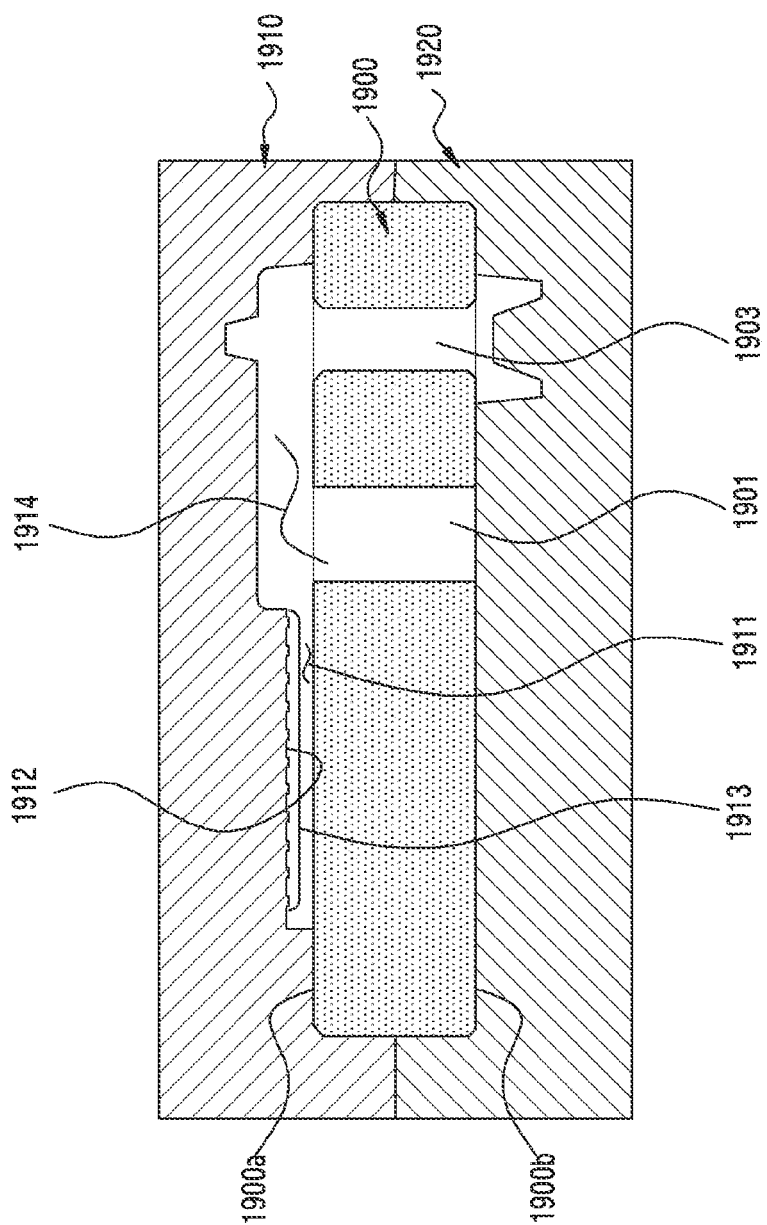
FIGS. 19 and 20 are diagrams for describing the manufacture flow of FIG. 18 according to an embodiment.
Figure 20:
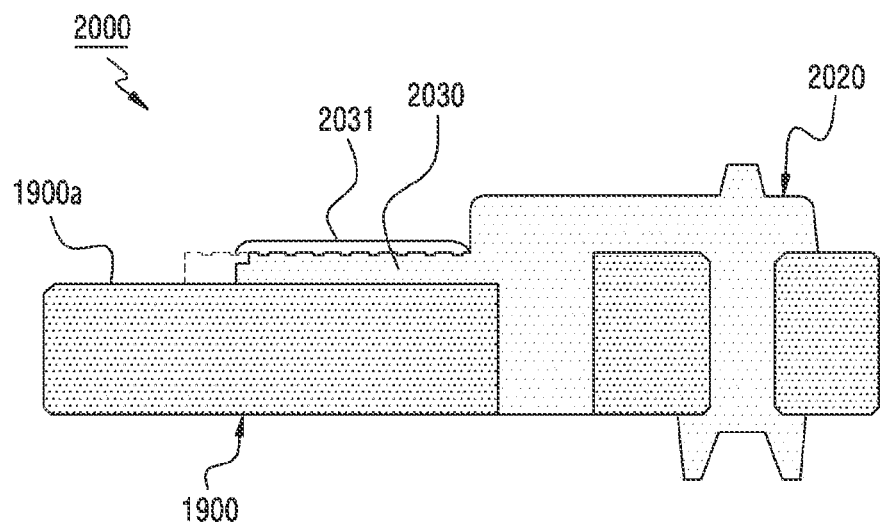

FIG. 18 illustrates a manufacture flow 1800 for an electronic device member of a metal structure and a non-metal structure according to an embodiment. FIGS. 19 and 20 are diagrams for describing the manufacture flow of FIG. 18 according to an embodiment.

Referring to FIGS. 18 and 19, in an embodiment, in operation 1801, a mold 1910 including at least one recess 1911 which faces one surface of a metal structure 1900 can be offered. In an embodiment, the metal structure 1900 is a plate-shaped metal structure including a first surface 1900a and a second surface 1900b, and can include one or more openings 1901 and 1903 penetrating the first surface 1900a and the second surface 1900b. According to an embodiment, at insert injection, after the metal structure 1900 is put between the molds 1910 and 1920, a polymeric material of a molten state can be injected.

According to an embodiment, the mold 1910 can include the at least one recess 1911 offering a molding space which can be used for injection quality or injection defect determination. The recess 1911 can include a surface (below, a fifth surface 1912) which is arranged to face the first surface 1900a of the metal structure 1900 and interpose the molding space therebetween.

According to an embodiment, the fifth surface 1912 can include a plurality of scales 1913. The plurality of scales 1913, for example, can be implemented as a line-shape protrusion protruded from the fifth surface 1912. According to various embodiments (not shown), the plurality of scales 1913 can be implemented as a line-shape groove in the fifth surface 1912 as well. According to an embodiment, the plurality of scales 1913 can be arranged at specific intervals.

According to an embodiment, in operation 1803, insert injection can be carried out using a polymeric material. Referring to FIG. 19, after the metal structure 1900 is put between the molds 1910 and 1920, a polymeric material of a molten state can be injected. Between the molds 1910 and 1920, there is a molding space 1904 defining a shape of a non-metal structure bonded to the metal structure 1900, and the polymeric material can be injected into this molding space 1904. Referring to FIG. 20, after the polymeric material is injected, a hybrid structure 2000 in which the metal structure 1900 and a non-metal structure 2020 are bonded can be obtained through cooling solidification and ejecting (e.g., mold separation).

According to an embodiment, in operation 1805, an injection defect can be determined on the basis of a state in which the recess is filled with the polymeric material. Referring to FIGS. 19 and 20, a structure (or a polymer structure) 2030 of the polymeric material filled in the recess 1911 of the mold 1910 through insert injection can be connected with the non-metal structure 2020 and be bonded with the first surface 1900a. The structure 2030 of the polymeric material can be extended to have a corresponding number of scales 2031 engraved by the scales 1913 of the mold 1910 correspondingly to an amount of the polymeric material filled in the recess 1911.

According to an embodiment, in response to injection being carried out in a set molding condition, the structure 2030 of the polymeric material can have a set number of scales 2031 or more. This can indicate that there is a low possibility in which the hybrid structure 2000 has an injection defect. According to an embodiment (not shown), in response to the injection not being carried out in the set molding condition, the structure of the polymeric material can have a smaller number of scales than the set number. This can indicate that there is a high possibility in which the hybrid structure has the injection defect.

According to some embodiment, the metal structure 1900 can be formed to have a scale along a region facing the recess 1911 among the first surface 1900a, in place of the scales 1913 of the mold 1910 as well. For example, in response to the structure 2030 of the polymeric material not being extended to a set scale or more (e.g., in response to the polymeric material not being filled by a set amount or more in the recess 1911), there can be a high possibility in which the hybrid structure 2000 has the injection defect. For example, in response to the structure 2030 of the polymeric material being extended to the set scale or more (e.g., in response to the polymeric material being filled by the set amount or more in the recess 1911), there can be a low possibility in which the hybrid structure 2000 has the injection defect.

According to an embodiment, in operation 1807, in response to it being determined that there is not the injection defect in operation 1805, the hybrid structure 2000 in which the non-metal structure of the polymeric material is bonded to the metal structure 1900 can be post processed. According to an embodiment, the post processing can include external form processing (e.g., cutting based on CNC) for making the hybrid structure into an external form such as the member 400 of FIG. 4. According to an embodiment, the post processing can include an operation of eliminating the structure 2030 of the polymeric material filled in the recess 1911 as well. According to various embodiments, the post processing can include a surface treatment such as polishing, depositing, coating or anodizing, after the external form processing.

Referring to FIG. 19, in various embodiments, the recess 1911 prepared in the mold 1910 can be extended to have various other repeating patterns. For example, the recess 1911 can be extended to have a pattern of repeating a corresponding shape (e.g., a W-shape, a sawtooth shape, or a straight line shape) as in FIG. 8A, 8B, 8C, 8D, 8E or 8F. The recess 1911 extended to have the pattern of repeating the corresponding shape can make it possible to check how much of the recess 1911 is filled with the polymeric material through insert injection, even without an indicator such as a scale.

Figure 21:
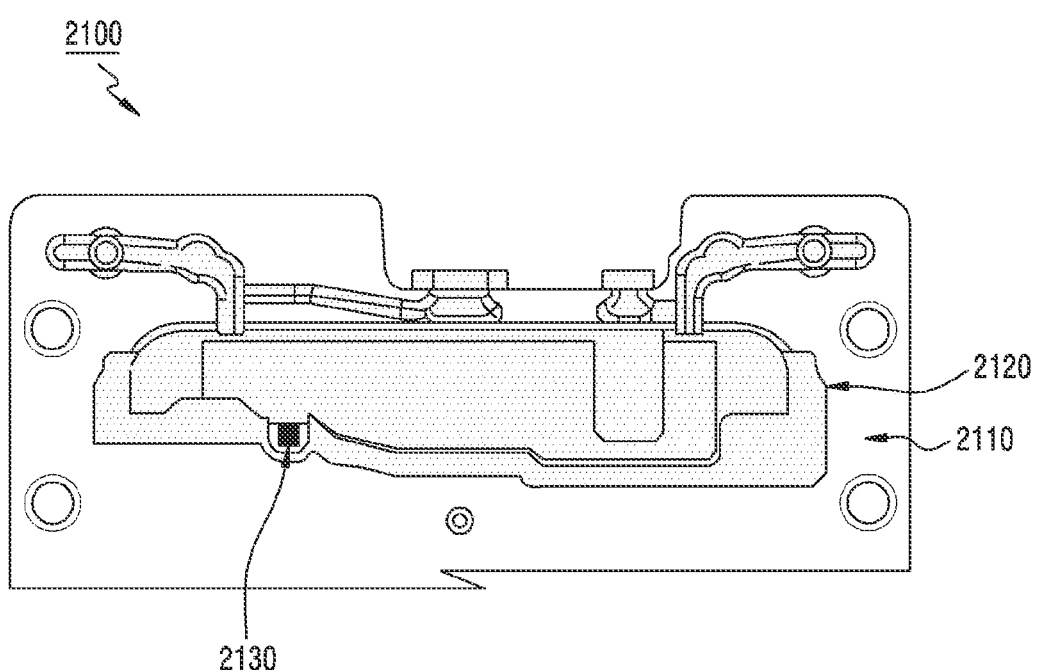
FIG. 21 illustrates a hybrid structure of a metal structure and a non-metal structure according to various embodiments.
Figure 22:
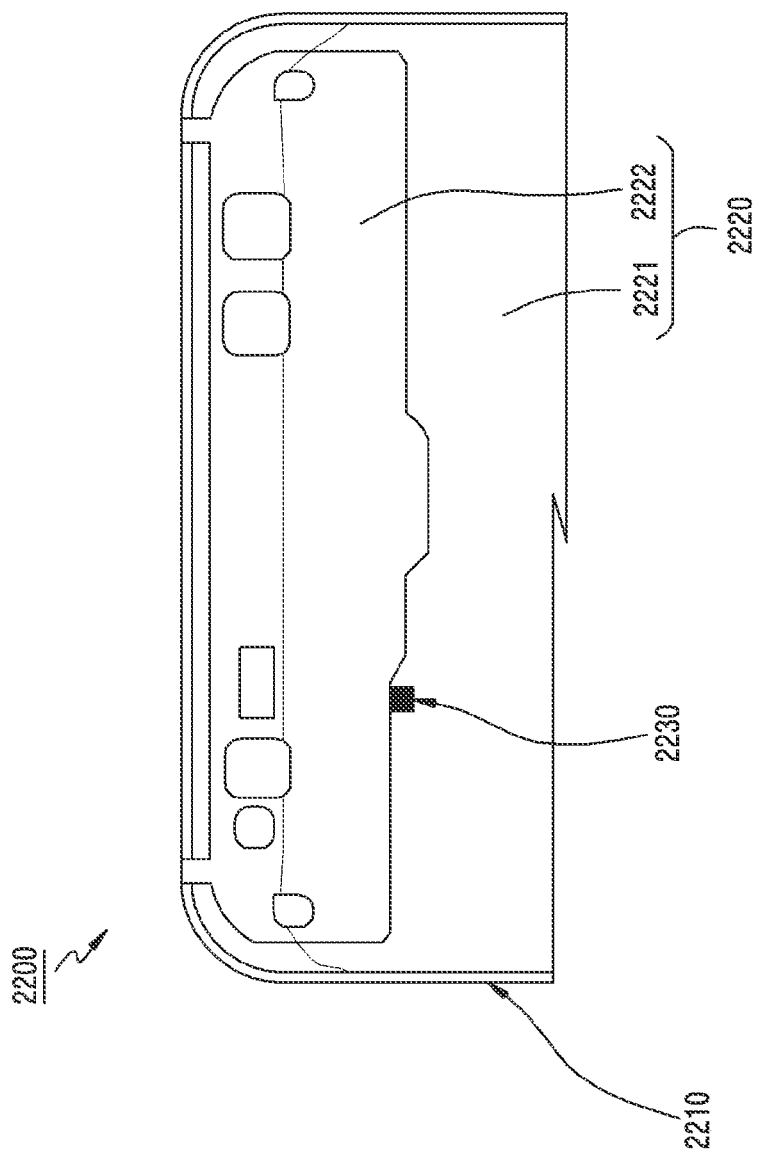
FIG. 22 illustrates a member prepared by post processing the hybrid structure of FIG. 21 according to an embodiment.

FIG. 21 illustrates a hybrid structure of a metal structure and a non-metal structure according to various embodiments. FIG. 22 illustrates a member prepared by post processing the hybrid structure of FIG. 21 according to an embodiment.

Referring to FIG. 21, in an embodiment, a hybrid structure 2100 in which a non-metal structure 2120 is bonded to a metal structure 2110 can be formed through insert injection. The hybrid structure 2100 can include a structure 2130 of a polymeric material being an indicator used for determining an injection quality or injection defect. The structure 2130 of the polymeric material, for example, can be formed by the recess 602 of the metal structure 600 in FIG. 7, or be formed by the recess 1911 of the mold 1910 in FIG. 19.

Referring to FIG. 22, in response to the hybrid structure 2100 of FIG. 21 being post processed, a member 2200 (e.g., the member 400 of FIG. 3) including an outer structure 2210 (e.g., the side bezel structure 410 of FIG. 3) and an inner structure 2220 (e.g., the inner structure 420 of FIG. 3) can be formed. The outer structure 2210 and an inner metal structure 2221 (e.g., the inner metal structure 421 of FIG. 3) of the inner structure 2220 can be formed from the metal structure 2110 of FIG. 21. An inner non-metal structure 2222 of the inner structure 2220 can be formed from the non-metal structure 2120 of FIG. 21.

According to an embodiment, at least a portion 2230 of the structure 2130 of the polymeric material being the indicator used for determining the injection quality or injection defect can be left even after the post processing.

According to an embodiment of the present disclosure, a method (e.g., the manufacture flow 500 of FIG. 5) for manufacturing an electronic device can include the operations of inserting and injecting (e.g., operation 503 of FIG. 5) a polymeric material into a structure, which is a plate-shaped metal structure (e.g., the metal structure 600 of FIG. 6B) including a first surface (e.g., the first surface 600*a* of FIG. 6B) and a second surface e.g., the second surface 600*b* of FIG. 6B), wherein the structure includes at least one opening (e.g., the one or more openings 601 and 603 of FIG. 6B) penetrating the first surface and the second surface, and at least one recess (e.g., the at least one recess 602 of FIG. 6B) having a first depth from the first surface and extending to have a repeating pattern selected from among a W-shape (e.g., the W-shape 830*a* of FIG. 8A), a sawtooth shape (e.g., the sawtooth shape 830*d* of FIG. 8D), and a straight line shape, when viewed from above the first surface, and checking (e.g., operation 505 of FIG. 5) whether the recess is filled with the polymeric material.

According to an embodiment of the present disclosure, the recess (e.g., the at least one recess 602 of FIG. 6B) can be connected with the opening (e.g., the one or more openings 601 and 602 of FIG. 6B).

According to an embodiment of the present disclosure, the first depth of the recess (e.g., the at least one recess 602 of FIG. 6B) can be about 0.3 mm or less.

According to an embodiment of the present disclosure, the pattern further includes a scale, and the operation (e.g., operation 505 of FIG. 5) of checking whether the recess is filled with the polymeric material can include the operation of using the scale.

According to an embodiment of the present disclosure, the method can include a plurality of identifiers engraved in the first surface along the recess, and the operation (e.g., operation 505 of FIG. 5) of checking whether the recess is filled with the polymeric material can include the operation of using the plurality of identifiers.

According to an embodiment of the present disclosure, after the operation (e.g., operation 505 of FIG. 5) of checking, the method can further include the operation (e.g., operation 507 of FIG. 5) of cutting the structure and eliminating the recess filled with the polymeric material.

According to an embodiment of the present disclosure, after the operation of cutting, the method can further include the operation (e.g., operation 507 of FIG. 5) of anodizing at least a portion of the structure.

According to an embodiment of the present disclosure, an electronic device e.g., the electronic device of FIG. 3) can include a front plate (e.g., the front plate 320 of FIG. 3), a back plate (e.g., the back plate 380 of FIG. 3) facing away from the front plate, a touch screen display (e.g., the display 330 of FIG. 3) exposed through the front plate, an outer metal structure (e.g., the side bezel structure 410 of FIG. 3) surrounding a space between the front plate and the back plate, and formed integrally with the back plate or coupled to the back plate, an inner metal structure (e.g., the inner metal structure 421 of FIG. 3) connected with or formed integrally with the outer metal structure, and arranged in the space, an inner non-metal structure (e.g., the one or more inner non-metal structures 422 and 423 of FIG. 3) coupled with the outer metal structure and the inner metal structure and arranged in the space, at least one recess (e.g., the at least one recess 602 of FIG. 6B) formed in one surface of the inner metal structure, and a polymer structure (e.g., the structure 2130 of FIG. 21) connected with or formed integrally with the inner non-metal structure by filling the at least one recess with a polymeric material, and including a plurality of scales.

According to an embodiment of the present disclosure, the recess (e.g., the at least one recess 602 of FIG. 6B) can be extended to have a repeating pattern selected from among a W-shape (e.g., the W-shape 830*a* of FIG. 8A), a sawtooth shape (e.g., the sawtooth shape 830*d* of FIG. 8B), or a straight line shape.

According to an embodiment of the present disclosure, the polymer structure (e.g., the polymer structure 1430 of FIG. 14) can have a thickness of about 0.3 mm or less.

According to an embodiment of the present disclosure, the polymer structure (e.g., the polymer structure 1430 of FIG. 14) can be extended from one end portion connected with the inner non-metal structure e.g., the one or more inner non-metal structures 422 and 423 of FIG. 3) to the other end portion, and have a thickness decreasing as it goes from the one end portion to the other end portion (referring to FIG. 17).

According to an embodiment of the present disclosure, the polymer structure (e.g., the polymer structure 1430 of FIG. 14) can have a set length extended from the one end portion to the other end portion.

According to an embodiment of the present disclosure, the plurality of scales (e.g., the plurality of scales 910 of FIG. 9) can be formed at specific intervals.

According to an embodiment of the present disclosure, the plurality of scales can be mutually different shapes (referring to FIGS. 15A, 15B and 15C).

According to an embodiment of the present disclosure, an electronic device (e.g., the electronic device 300 of FIG. 3) can include a front plate (e.g., the front plate 320 of FIG. 3), a back plate (e.g., the back plate 380 of FIG. 3) facing away from the front plate, a touch screen display (e.g., the display 330 of FIG. 3) exposed through the front plate, an outer metal structure (e.g., the side bezel structure 410 of FIG. 3) surrounding a space between the front plate and the back plate, and formed integrally with the back plate or coupled to the back plate, an inner metal structure (e.g., the inner metal structure 421 of FIG. 3) connected with or formed integrally with the outer metal structure, and arranged in the space, an inner non-metal structure (e.g., the one or more inner non-metal structures 422 and 423 of FIG. 3) coupled with the outer metal structure and the inner metal structure and arranged in the space, and a polymer structure (e.g., the structure 2030 of FIG. 20) formed in one surface of the inner metal structure, and connected with or formed integrally with the inner non-metal structure, and including a plurality of scales.

According to an embodiment of the present disclosure, the polymer structure (e.g., the structure 2030 of FIG. 20) can be extended to have a repeating pattern selected from among a W-shape, a sawtooth shape, or a straight line shape.

According to an embodiment of the present disclosure, the polymer structure (e.g., the structure 2030 of FIG. 20) can have a thickness of about 0.3 mm or less.

According to an embodiment of the present disclosure, the polymer structure (e.g., the polymer structure 2030 of FIG. 20) can be extended from one end portion connected with the inner non-metal structure to the other end portion, and have a thickness decreasing as it goes from the one end portion to the other end portion.

According to an embodiment of the present disclosure, the polymer structure (e.g., the structure 2030 of FIG. 20) can have a set length extended from the one end portion to the other end portion.

According to an embodiment of the present disclosure, the plurality of scales e.g., the scales 2031 of FIG. 20) can be formed at specific intervals.

Until now, a description has been made for the present disclosure focusing on preferred embodiments. A person having ordinary skill in the art to which the present disclosure pertains would be able to understand that the present disclosure can be implemented in a modified form within a scope not departing from the essential characteristics of the present disclosure. Therefore, the disclosed embodiments should be taken into consideration in a descriptive aspect, not in a restrictive aspect. The scope of the present disclosure is represented in claims, not in the aforementioned description, and all differences within a scope equivalent thereto should be construed as being included in the present disclosure.

The invention claimed is:

1. An electronic device, comprising:
a front plate;
a back plate facing away from the front plate;
a touch screen display exposed through the front plate;
an outer metal structure surrounding a space between the front plate and the back plate, and formed integrally with the back plate or coupled to the back plate;
an inner metal structure connected with or formed integrally with the outer metal structure, and arranged in the space;
an inner non-metal structure coupled with the outer metal structure and the inner metal structure and arranged in the space;
at least one recess formed in one surface of the inner metal structure; and
a polymer structure formed in the one surface of the inner metal structure by filling the at least one recess with a polymeric material, and connected with or formed integrally with the inner non-metal structure, and comprising a plurality of scales,
wherein the at least one recess is extended to have a repeating pattern comprising at least one of a W-shape, a sawtooth shape, a planar rectangular spiral shape, or a planar circular spiral shape,
wherein the at least one recess comprise a first area and a second area that is disposed closer to an opening than the first area, and
wherein a width of the second area is bigger than a width of the first area.

2. The electronic device of claim 1, wherein the polymer structure has a thickness of 0.3 mm or less.

3. The electronic device of claim 1, wherein the polymer structure is extended from one end portion connected with the inner non-metal structure to the other end portion, and has a thickness decreasing as it goes from the one end portion to the other end portion.

4. The electronic device of claim 3, wherein the polymer structure has a set length extended from the one end portion to the other end portion.

5. The electronic device of claim 1, wherein the plurality of scales are formed at specific intervals.

* * * * *